(12) United States Patent
Yamamoto

(10) Patent No.: US 10,411,121 B2
(45) Date of Patent: Sep. 10, 2019

(54) METHOD OF MANUFACTURING SEMICONDUCTOR DEVICE

(71) Applicant: Renesas Electronics Corporation, Tokyo (JP)

(72) Inventor: Yoshiki Yamamoto, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/100,908

(22) Filed: Aug. 10, 2018

(65) Prior Publication Data

US 2019/0123182 A1 Apr. 25, 2019

(30) Foreign Application Priority Data

Oct. 20, 2017 (JP) ................. 2017-203343

(51) Int. Cl.
*H01L 21/336* (2006.01)
*H01L 29/66* (2006.01)
(Continued)

(52) U.S. Cl.
CPC .... *H01L 29/66833* (2013.01); *H01L 21/0214* (2013.01); *H01L 21/28017* (2013.01); *H01L 21/28202* (2013.01); *H01L 21/28282* (2013.01); *H01L 21/823462* (2013.01); *H01L 21/823857* (2013.01); *H01L 27/0617* (2013.01); *H01L 27/11563* (2013.01); *H01L 27/11568* (2013.01); *H01L 27/11573* (2013.01); *H01L 29/518* (2013.01); *H01L 29/6656* (2013.01); *H01L 29/66575* (2013.01); *H01L 29/792* (2013.01)

(58) Field of Classification Search
CPC ........... H01L 21/0214; H01L 21/28282; H01L 27/11563; H01L 29/66833; H01L 29/518

USPC ........................................ 438/257
See application file for complete search history.

(56) References Cited

U.S. PATENT DOCUMENTS 8,916,432 B1 12/2014 Ramkumar et al.
9,412,599 B2 8/2016 Ishida et al.
(Continued)

FOREIGN PATENT DOCUMENTS

JP 2015-118974 A 6/2015

OTHER PUBLICATIONS

Extended European Search Report dated Apr. 1, 2019 for European Patent Application No. 18188632.6-1212.

*Primary Examiner* — David S Blum
(74) *Attorney, Agent, or Firm* — McGinn IP Law Group, PLLC

(57) ABSTRACT

The reliability of a semiconductor device is improved. A first insulating film and a protective film are formed on a semiconductor substrate. The first insulating film and the protective film of a first region are selectively removed, and an insulating film is formed on the exposed semiconductor substrate. In a state where the first insulating film in a second region, a third region, and a fourth region is covered with the protective film, the semiconductor substrate is heat-treated in an atmosphere containing nitrogen, thereby introducing nitrogen to the interface between the semiconductor substrate and the second insulating film in the first region. In other words, a nitrogen introduction point is formed on the interface between the semiconductor substrate and the second insulating film. In this configuration, the protective film acts as an anti-nitriding film.

14 Claims, 22 Drawing Sheets

(51) Int. Cl.
*H01L 29/792* (2006.01)
*H01L 29/51* (2006.01)
*H01L 27/11563* (2017.01)
*H01L 21/02* (2006.01)
*H01L 21/28* (2006.01)
*H01L 21/8234* (2006.01)
*H01L 21/8238* (2006.01)
*H01L 27/06* (2006.01)
*H01L 27/11568* (2017.01)
*H01L 27/11573* (2017.01)

(56) References Cited

U.S. PATENT DOCUMENTS

2008/0293207 A1   11/2008   Koutny, Jr. et al.
2008/0303968 A1*  12/2008   Terada ............ H01L 21/823456
                                                        349/46
2014/0353756 A1*  12/2014   Yamamoto .......... H01L 27/1203
                                                        257/351

* cited by examiner

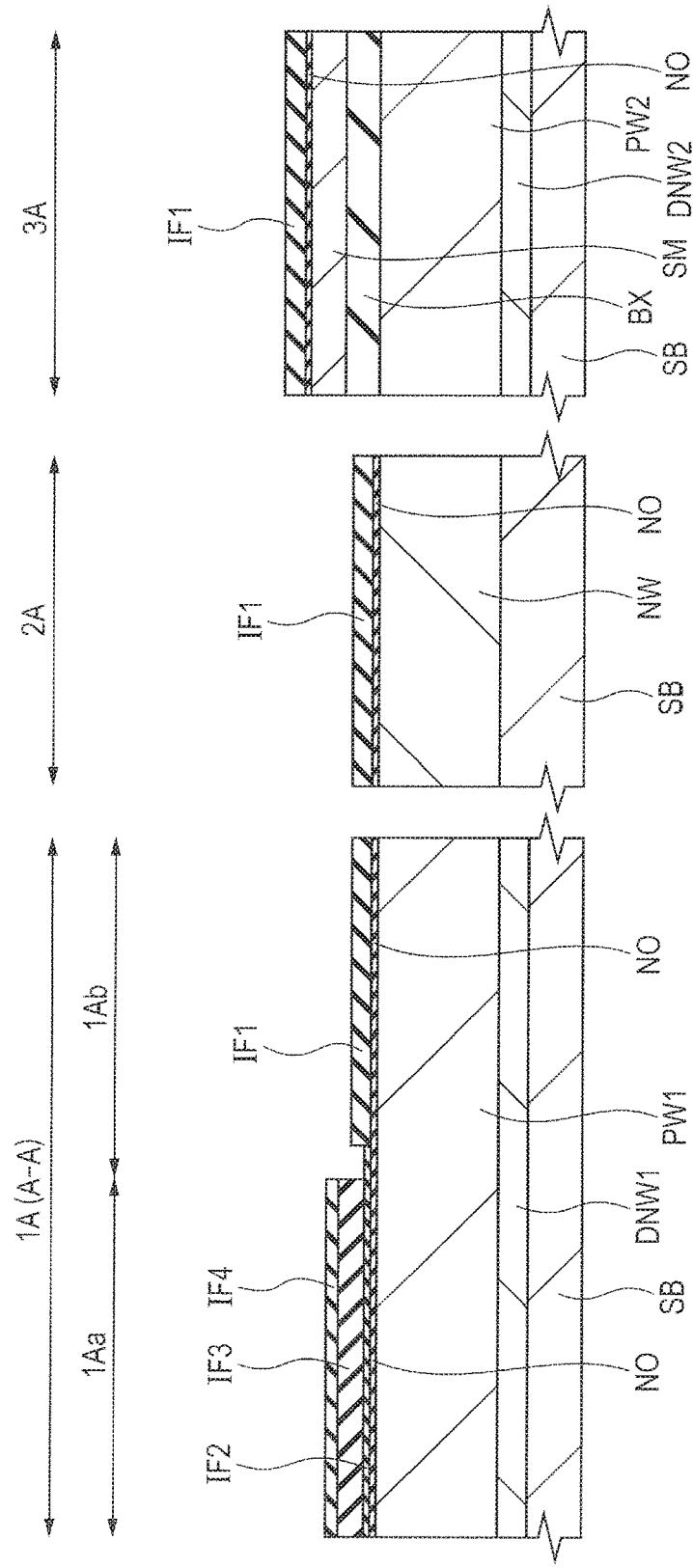

METHOD OF MANUFACTURING SEMICONDUCTOR DEVICE

CROSS-REFERENCE TO RELATED APPLICATIONS

The disclosure of Japanese Patent Application No. 2017-203343 filed on Oct. 20, 2017 including the specification, drawings and abstract is incorporated herein by reference in its entirety.

The present invention relates to a method of manufacturing a semiconductor device and relates to, for example, a technique effectively used for a semiconductor device having a nonvolatile memory cell.

BACKGROUND

As electrically writable and erasable nonvolatile memory cells, electrically erasable and programmable read only memory (EEPROM) and flash memory have been widely used. In such nonvolatile memory cells, a floating gate electrode or a trap insulating film, which is interposed between insulating films such as oxide films, is provided under the gate electrode of a metal insulator semiconductor field-effect transistor (MISFET). A state of charge stored in the floating gate electrode or the trap insulating film serves as storage information. The trap insulating film is an insulating layer where charge can be stored, for example, a silicon nitride film. Metal-oxide-nitride-oxide-semiconductor (MONOS) transistors are widely used as nonvolatile memory cells.

For example, Japanese Unexamined Patent Application Publication No. 2015-118974 discloses a technique of forming three kinds of transistors having different withstand voltages and MONOS transistors on a semiconductor substrate.

Furthermore, U.S. Pat. No. 8,916,432 discloses a technique in which an insulating film (ONO film) is formed by sequentially stacking an oxide film, a nitride film, and an oxide film over a semiconductor substrate having a MOS transistor region and a nonvolatile memory transistor, and then the ONO film formed on the MOS transistor region is removed.

SUMMARY

For the gate insulating film of the MONOS transistor, a silicon oxide film is first formed as a lower film by thermally oxidizing the semiconductor substrate, a silicon nitride film is formed as a charge storage layer on the lower film, and then a silicon oxide film is formed as an upper film on the charge storage layer. At this point, in order to improve nonvolatile memory characteristics such as retention, the lower film is heat-treated in an atmosphere of NO or N20 so as to introduce nitrogen to the interface between the lower layer and the semiconductor substrate. However, the heat treatment is performed over the semiconductor substrate and thus may change or deteriorate the characteristics of a MISFET formed in a different region from the MONOS transistor.

Other problems and new features will be clarified by the description and the accompanying drawings of the present specification.

According to an embodiment, a method of manufacturing a semiconductor device including a first region where a first MISFET is to be formed and a second region where a second MISFET is to be formed, comprising the steps of: (a) forming a first insulating film on a semiconductor substrate in the first region and the second region, and (b) forming, on the first insulating film, a protective film made of a different material from the first insulating film.

According to an embodiment, a method of manufacturing a semiconductor device including a first region where a first MISFET is to be formed and a second region where a second MISFET is to be formed, comprising the steps of: (a) forming a first insulating film on a semiconductor substrate in the first region and the second region, and (b) forming, on the first insulating film, a protective film made of a different material from the first insulating film. The method of manufacturing the semiconductor device further includes the step of (e) introducing nitrogen to the interface between the semiconductor substrate and the second insulating film in the first region by performing a heat treatment on the semiconductor substrate in an atmosphere containing nitrogen and oxygen in a state where the first insulating film of the second region is covered with the protective film. The method of manufacturing the semiconductor device further includes the steps of: (f) removing the protective film of the second region, (g) forming a first conductive film on the second insulating film of the first region and the first insulating film of the second region, and (h) forming a first gate electrode for the first MISFET in the first region and a second gate electrode in the second region by patterning the first conductive film.

According to the embodiment, the reliability of the semiconductor device can be improved.

BRIEF DESCRIPTION OF THE DRAWINGS

FIG. 23 is a cross-sectional view showing a manufacturing step of the semiconductor device after FIG. 22.

DETAILED DESCRIPTION

Figure 1:
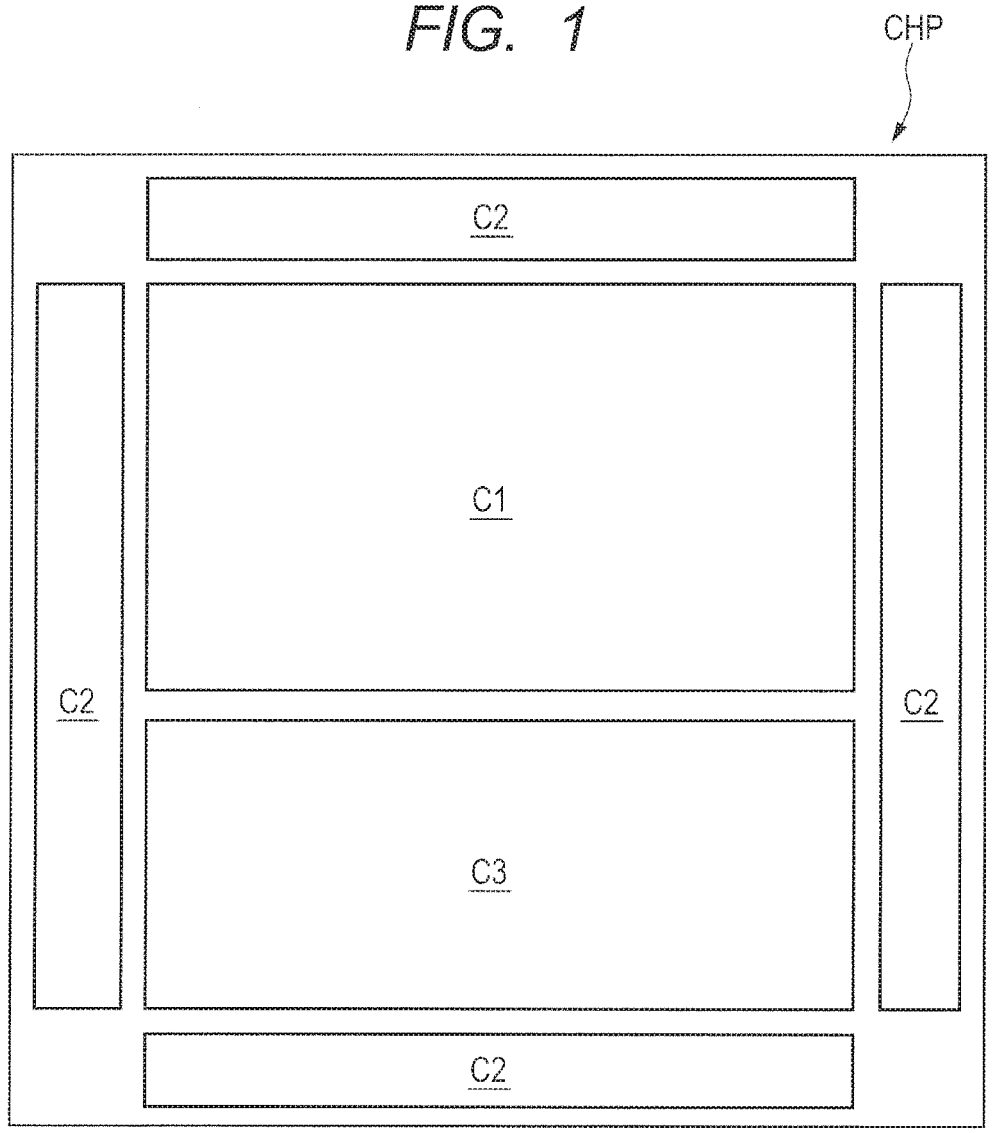
FIG. 1 is a circuit block diagram showing the layout of a semiconductor chip serving as a semiconductor device according to an embodiment.

For the convenience of explanation, a plurality of sections or embodiments may be separately described. The sections or embodiments are relevant to one another unless otherwise specified. One of the sections or embodiments is, for example, a modification, an application, a detailed explanation, and a supplementary explanation of some or all of the other sections or embodiments. In the following embodiment, the number of elements (including a number, a numeric value, an amount, and a range) is not limited to a specific number unless otherwise specified or clearly limited to the specific number in theory. Thus, the number of elements may be larger or smaller than the specific number. Furthermore, the constituent elements (including operation steps) of the following embodiment are not always necessary unless otherwise specified and clearly required in theory. Similarly, the shapes and positional relationships of the constituent elements in the following embodiments substantially include close or similar shapes of the constituent elements unless otherwise specified or clearly excluded in theory.

This also holds true for the numeric value and the range. An embodiment will be specifically described below with reference to the accompanying drawings. Members having the same function are indicated by the same reference numerals and the repeated explanation thereof is omitted in all the drawings for explaining the embodiment. In the following embodiment, the explanation of the same or similar parts will not be repeated in principle unless necessary.

In the drawings of the embodiment, hatching may be omitted to improve visibility.

Embodiment

FIG. 1 is a circuit block diagram roughly showing the layout of a semiconductor chip CHP serving as a semiconductor device of the present embodiment.

A circuit block C1 is a region that constitutes a nonvolatile memory circuit, e.g., EEPROM and flash memory and includes a plurality of memory cells MC formed as semiconductor elements.

A circuit block C2 is a region that constitutes an input/output (I/O) circuit and includes a high voltage MISFET formed as a semiconductor element driven at a voltage of about 3.3 V.

A circuit block C3 is a region that constitutes a logic circuit including a central processing unit (CPU) and static random-access memory (SRAM) and includes a low voltage MISFET formed as a semiconductor element driven at a lower withstand voltage than the high voltage MISFET and at a voltage of about 0.75 V.

Figure 2:
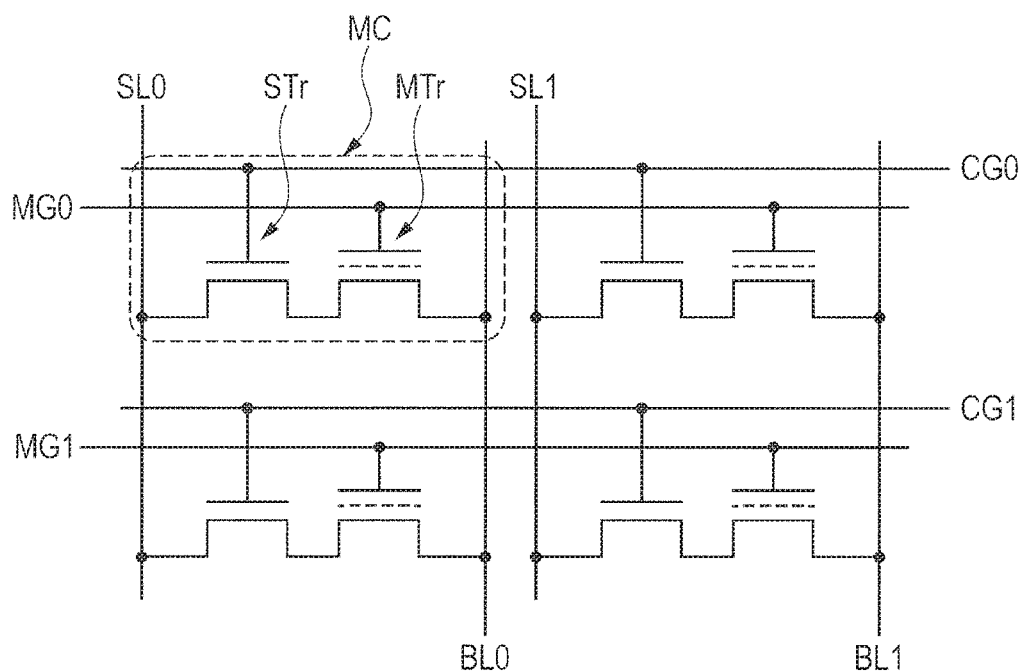
FIG. 2 is a circuit diagram showing a memory cell in a part of a nonvolatile memory circuit.
Figure 3:
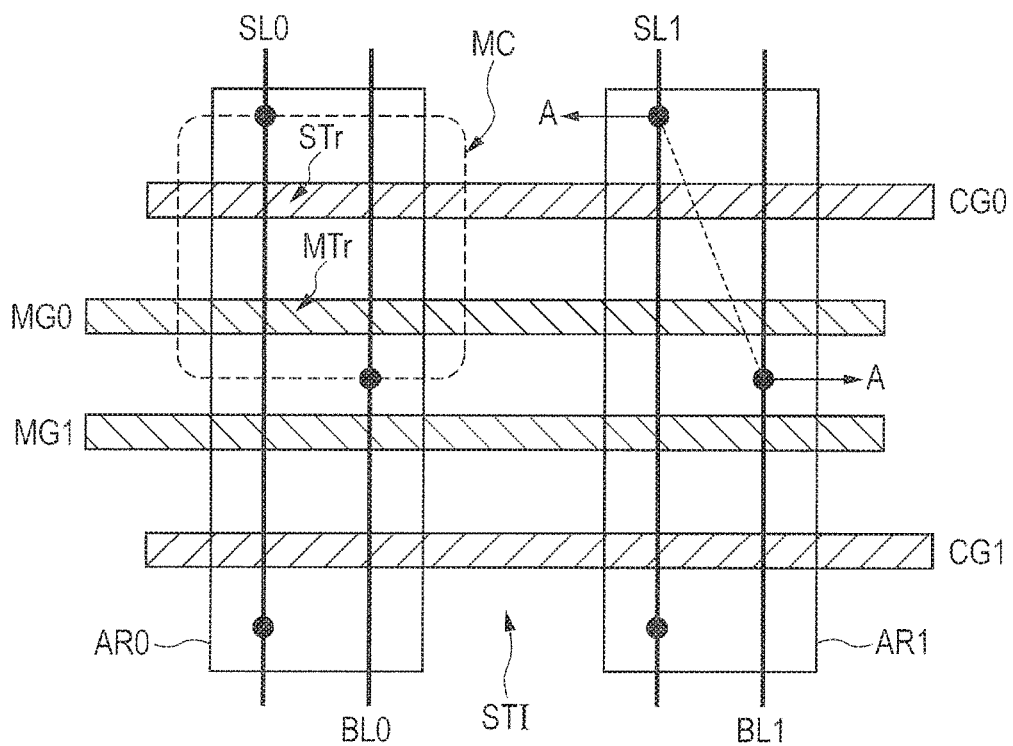
FIG. 3 shows the layout of the memory cell in a part of the nonvolatile memory circuit.

FIGS. 2 and 3 show a part of the nonvolatile memory circuit of the circuit block C1 as a circuit diagram and a layout plan view of the four memory cells (nonvolatile memory cells) MC. In the plan view of FIG. 3, memory gate lines MG0 and MG1 and control gate lines CG0 and CG1 are hatched so as to be clearly viewed.

Each of the memory cells MC includes a memory transistor MTr and a select transistor STr and is coupled to, for example, the memory gate line MG0, the control gate line CG0, a bit line BL0, and a source line SL0. The memory cells MC are formed in active regions AR0 and AR1 separated by a device isolation part STI. The active regions AR0 and AR1 mainly include a diffusion region MS and an impurity region LMS that are formed as source regions for the memory cell MC and a diffusion region MD and an impurity region LMD that are formed as drain regions for the memory cell MC.

The configurations shown in FIGS. 2 and 3 will be discussed below with reference to a region 1A in FIG. 20, a cross-sectional view of the memory cell MC.

Figure 20:
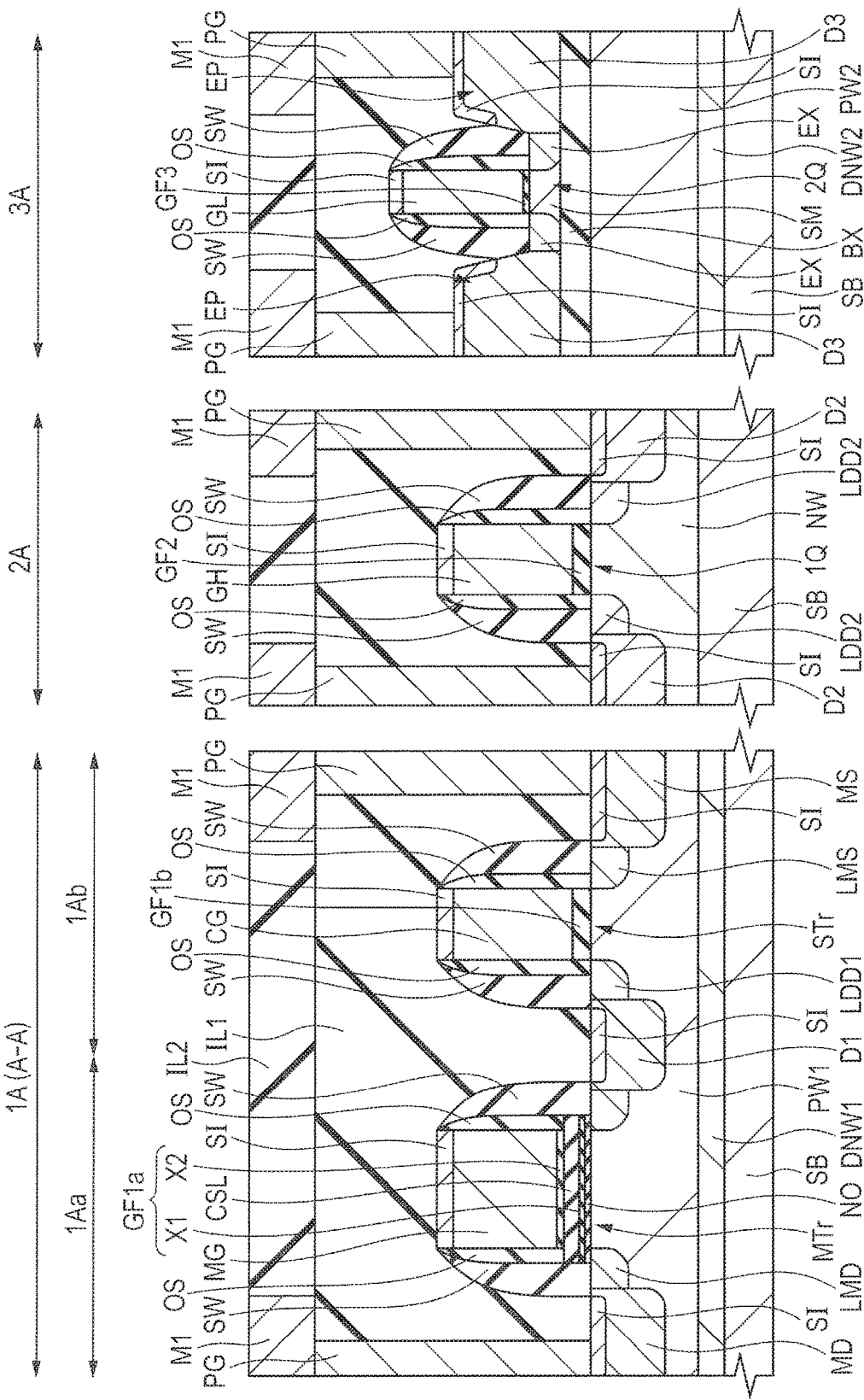
FIG. 20 is a cross-sectional view showing a manufacturing step of the semiconductor device after FIG. 19.

Each of the memory gate lines MG0 and MG1 extends in the X direction, is coupled to the memory cells MC adjacent to each other in the X direction, and includes a memory gate electrode MG shown in FIG. 20.

Each of the control gate lines CG0 and CG1 extends in the X direction, is coupled to the memory cells MC adjacent to each other in the X direction, and includes a control gate electrode CG shown in FIG. 20.

Each of the bit lines BL0 and BL1 extends in the Y direction, is coupled to the memory cells MC adjacent to each other in the Y direction, and is electrically coupled to the diffusion region MD and the impurity region LMD that constitute the drain region shown in FIG. 20. Moreover, the bit lines BL0 and BL1 each include, for example, a wire M1 shown in FIG. 20 or a wire (not shown) above the wire M1.

Each of the source lines SL0 and SL1 extends in the Y direction, is coupled to the memory cells MC adjacent to each other in the Y direction, and is electrically coupled to the diffusion region MS and the impurity region LMS that constitute the source region shown in FIG. 20. Furthermore, the source lines SL0 and SL1 each include, for example, the wire M1 shown in FIG. 20 or a wire (not shown) above the wire M1. The source lines SL0 and SL1 are each coupled to a global source line and receive a common potential.

<A Method of Manufacturing the Semiconductor Device>

Referring to FIGS. 4 to 20, a method of manufacturing the semiconductor device according to the present embodiment will be described below. First, the region 1A and regions 2A and 3A in FIGS. 4 to 20 will be discussed below.

In the region 1A, the memory cell MC is formed as a semiconductor element constituting the nonvolatile memory circuit of the circuit block C1 in the semiconductor chip CHP. The region 1A corresponds to a cross-sectional view taken along line A-A of FIG. 3. The region 1A includes a region 1Aa and a region 1Ab. In the region 1Aa, the memory transistor MTr of the memory cell MC is formed. In the region 1Ab, the select transistor STr of the memory cell MC is formed.

In the region 2A, a p-type MISFET 1Q is formed that is a high voltage MISFET of the circuit block C2 in the semiconductor chip CHP. Although an n-type high voltage MISFET is also formed in the circuit block C2, the explanation thereof is omitted.

In the region 3A, an n-type MISFET 2Q is formed that is a low voltage MISFET of the circuit block C3 in the semiconductor chip CHP. Although a p-type high voltage MISFET is also formed in the circuit block C3, the explanation thereof is omitted.

Figure 4:
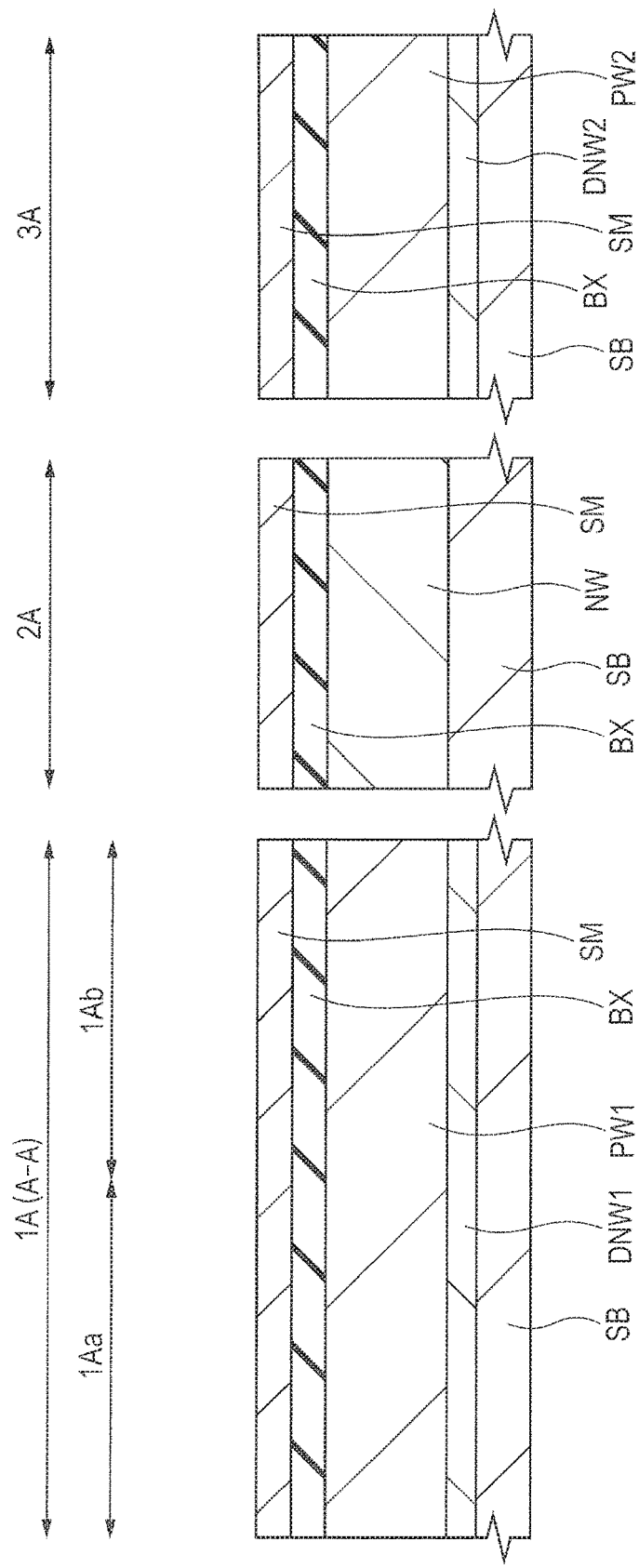
FIG. 4 is a cross-sectional view showing a manufacturing step of the semiconductor device according to the embodiment.

FIG. 4 shows a so-called silicon on insulator (SOI) substrate that includes a semiconductor substrate SB serving as a support substrate, an insulating layer BX formed on the semiconductor substrate SB, and a semiconductor layer SM formed on the insulating layer BX.

The semiconductor substrate SB is preferably made of single crystal silicon having a specific resistance of about 1 to 10 Ωcm, for example, p-type single crystal silicon. For example, the insulating layer BX is made of silicon oxide and has a thickness of about 10 to 20 nm. The semiconductor layer SM is preferably made of single crystal silicon having a specific resistance of about 1 to 10 Ωcm and has a thickness of, for example, 10 to 20 nm. An impurity is not introduced to the semiconductor layer by ion implantation or the like.

An example of the step of preparing the SOI substrate will be described below. The SOI substrate can be manufactured through separation by implanted oxygen (SIMOX). In SIMOX, oxygen ($O_2$) is ion-implanted with high energy to the semiconductor substrate made of silicon (Si), and then silicon and oxygen are bound by subsequent heat treatment, forming the insulating layer BX made of silicon oxide at a slightly deeper position than the surface of the semiconductor substrate. In this case, a thin film of silicon remaining on the insulating layer BX is formed into the semiconductor layer SM in a state where a semiconductor substrate under the insulating layer BX is formed into the semiconductor substrate SB. Alternatively, the SOI substrate may be formed by bonding. In bonding, for example, the surface of a first semiconductor substrate made of silicon is oxidized to form the insulating layer BX, and then a second semiconductor substrate made of silicon is bonded to the first semiconductor substrate by contact bonding at high temperatures. Thereafter, the second semiconductor substrate is reduced in thickness. In this case, a thin film of the semiconductor substrate remaining on the insulating layer BX is formed into the semiconductor layer SM in a state where the first semiconductor substrate under the insulating layer BX is formed into the semiconductor substrate SB. The SOI substrate may be fabricated by another method, e.g., the smart cut process.

Subsequently, grooves are formed through the semiconductor layer SM, the insulating layer BX, and the semiconductor substrate SB and are filled with insulating films, forming the device isolation parts STI (not shown). The regions 1A to 3A are isolated from one another by the device isolation parts STI.

Then, according to photolithography and ion implantation, an n-type well NW is formed on the semiconductor substrate SB of the region 2A, an n-type well DNW if formed on the semiconductor substrate SB of the first region 1A, and a p-type well PW1 is formed in the well DNW1. Ions may be implanted to the surface of the well PW1 of the region 1A and the surface of the well NW of the region 2A in order to adjust a threshold value.

Subsequently, according to photolithography and ion implantation, an n-type well DNW2 is formed on the semiconductor substrate SB of the region 3A, and a p-type well PW2 is formed in the well DNW2. The well PW2 is a region acting as the gate of the MISFET 2Q along with a gate electrode GL, which will be discussed later, and a region for controlling the threshold value of the MISFET 2Q by applying a voltage to the well PW2 independently from the gate electrode GL. In order to applying a voltage to the well PW2, the semiconductor layer SM and the insulating layer BX of the region 3A are partially removed and the well PW2 is exposed as a feeding region. The explanation of the feeding region is omitted. Moreover, a p-type impurity region having a higher concentration than the well PW2 may be formed on the surface of the well PW2 in contact with the insulating layer BX.

Figure 5:
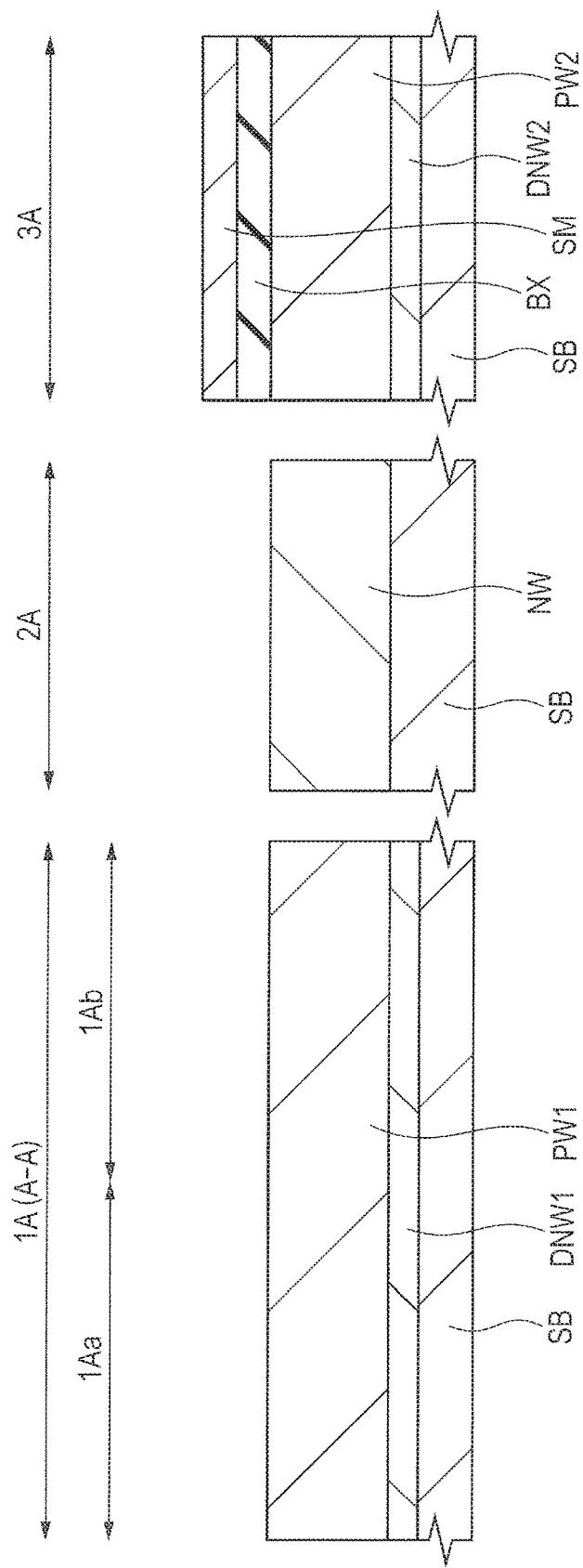
FIG. 5 is a cross-sectional view showing a manufacturing step of the semiconductor device after FIG. 4.

Then, as shown in FIG. 5, the semiconductor layer SM and the insulating layer BX of the region 1A and the region 2A are selectively and sequentially removed so as to leave the semiconductor layer SM and the insulating layer BX of the region 3A, exposing the semiconductor substrate SB of the region 1A and the region 1B.

Figure 6:
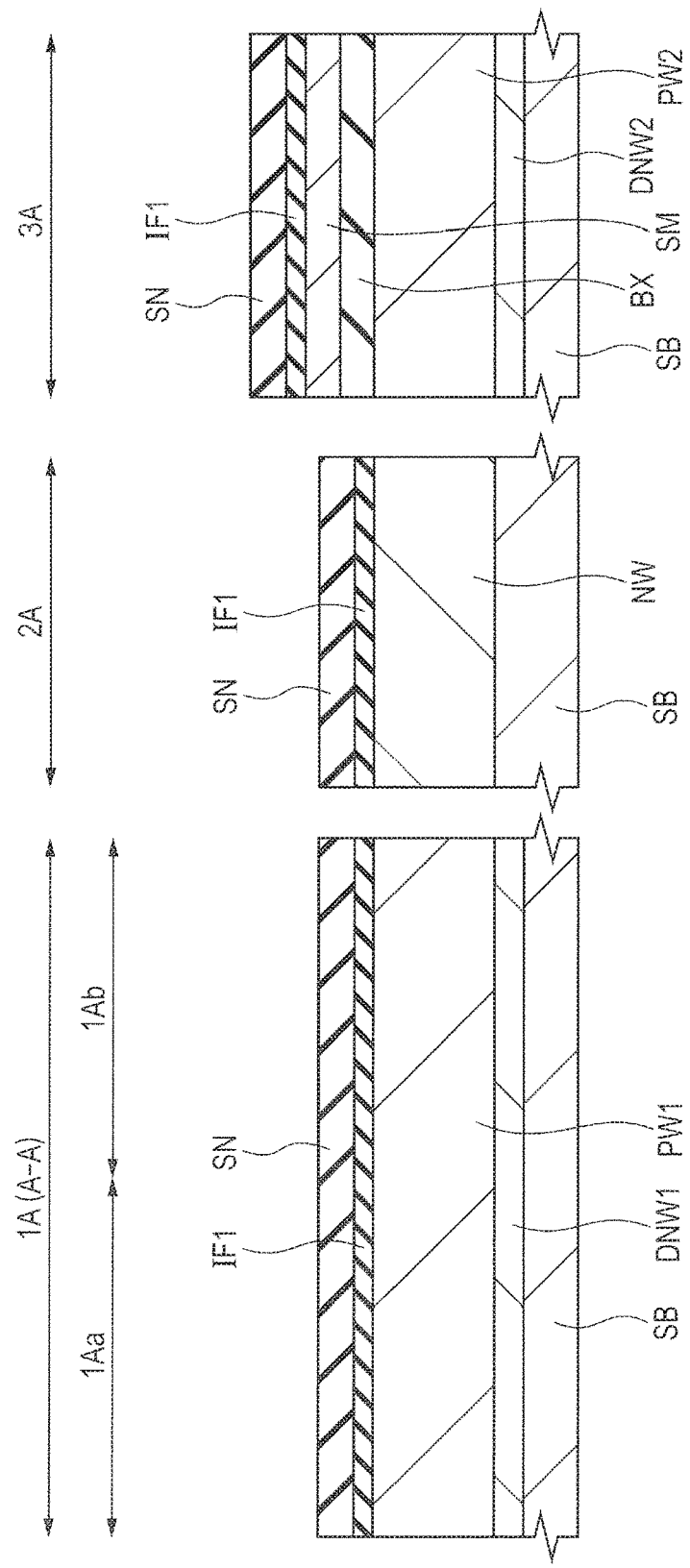
FIG. 6 is a cross-sectional view showing a manufacturing step of the semiconductor device after FIG. 5.

Subsequently, as shown in FIG. 6, for example, an insulating film IF1 including a silicon oxide film is formed on the semiconductor layer SM of the region 3A and the semiconductor substrate SB of the region 1A and the region 2A by thermal oxidation. The insulating film IF1 has a thickness of about 8 nm.

Then, a protective film SN is formed on the insulating film IF1. The protective film SN can be formed by, for example, chemical vapor deposition (CVD) and includes, for example, a silicon nitride film. The protective film SN has a thickness of about 5 to 30 nm.

The protective film SN is provided to prevent nitrogen from being introduced to the interface between the insulating film IF1 and the semiconductor substrate SB of the region 2A and the interface between the insulating film IF1 and the semiconductor layer SM of the region 3A in subsequent NO treatment. Thus, the protective film SN is preferably made of a different material from the insulating film IF1. The protective film SN may be any film, e.g., a polysilicon film or a titanium nitride film as long as the film acts as an anti-nitriding film.

Figure 7:
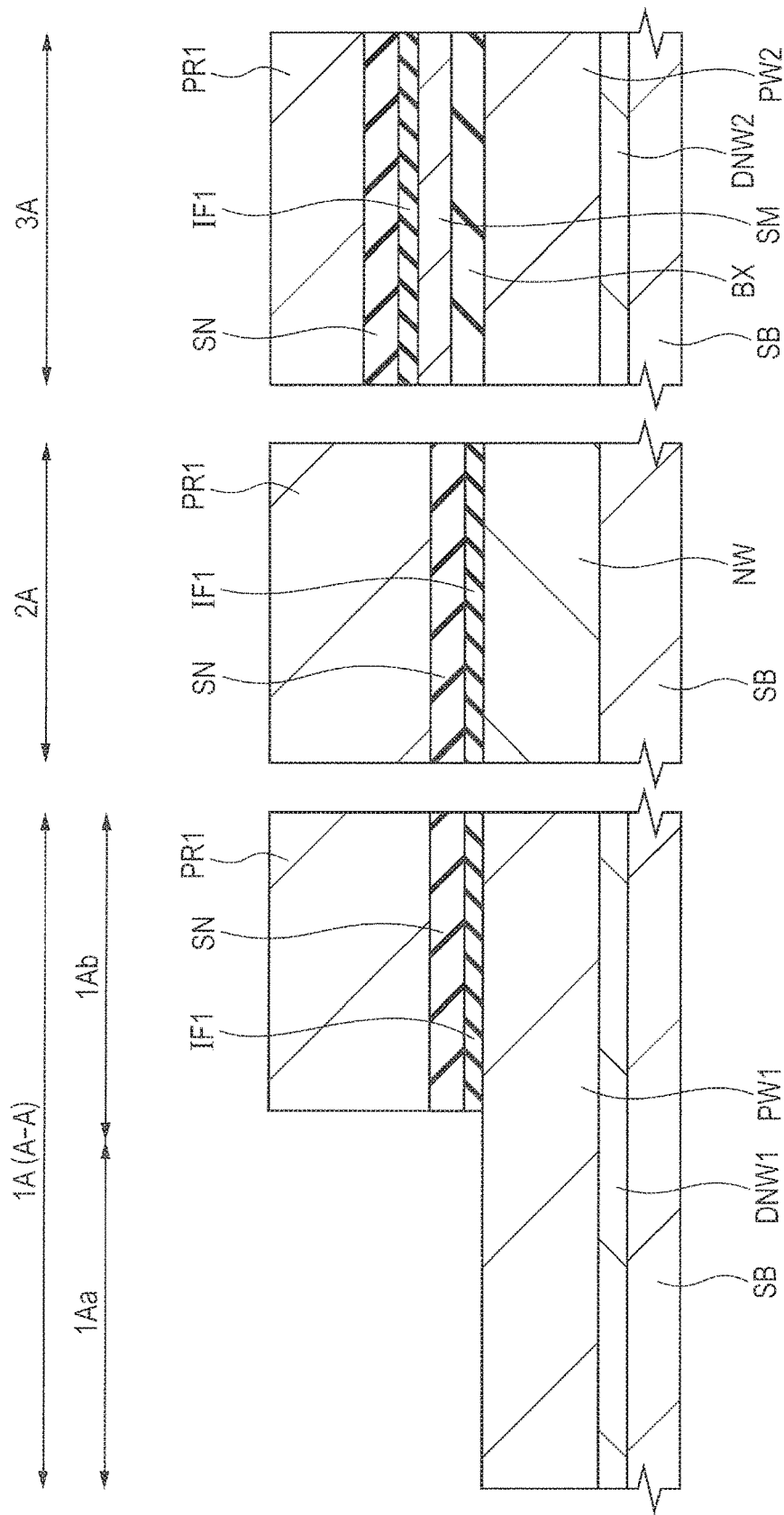
FIG. 7 is a cross-sectional view showing a manufacturing step of the semiconductor device after FIG. 6.

Then, as shown in FIG. 7, a resist pattern PR1 is formed so as to cover the region 1Ab, the region 2A, and the region 3A and expose the region 1Aa. Subsequently, etching is performed with the resist pattern PR1 serving as a mask, so that the protective film SN and the insulating film IF1 are selectively removed and the semiconductor substrate SB is exposed in the region 1Aa. The resist pattern PR1 is then removed by asking.

Figure 8:
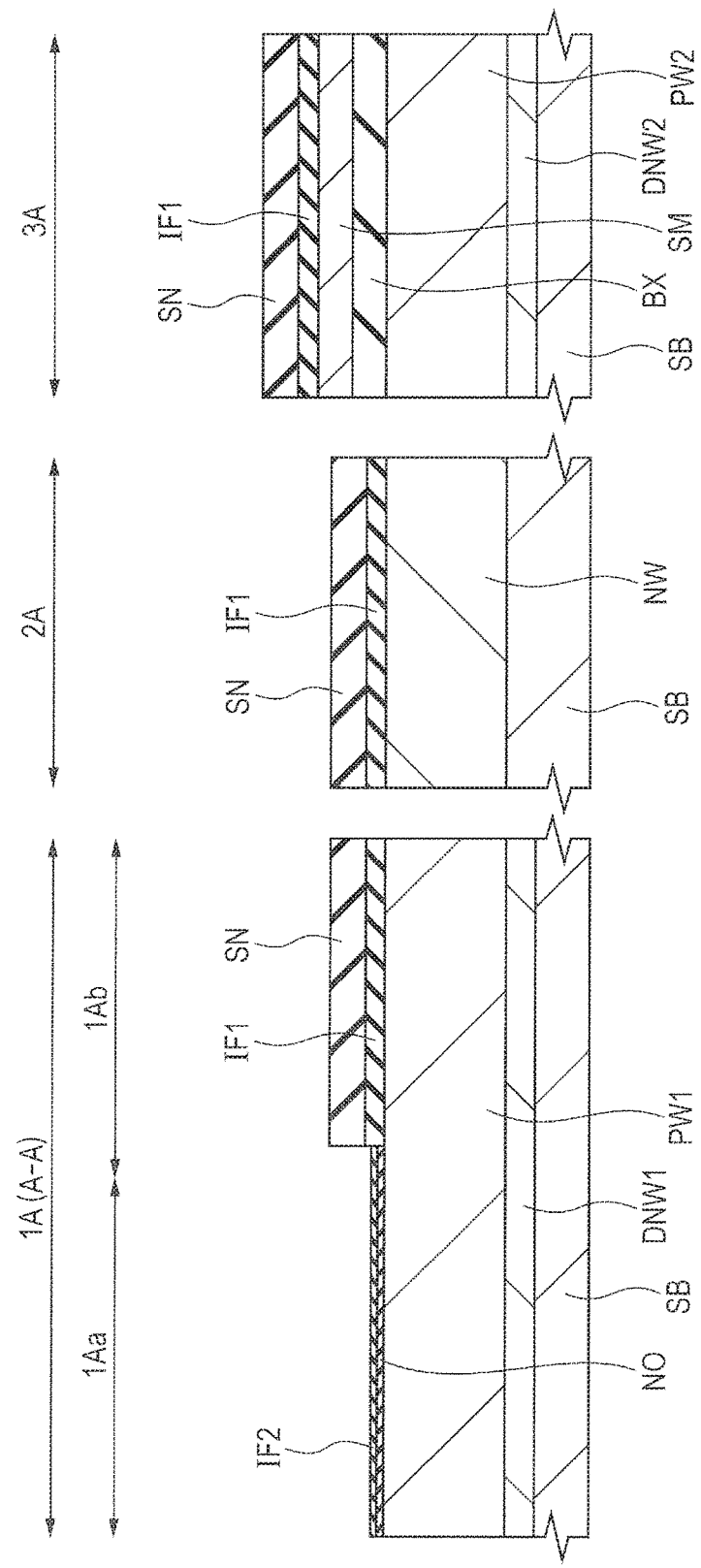
FIG. 8 is a cross-sectional view showing a manufacturing step of the semiconductor device after FIG. 7.

Subsequently, as shown in FIG. 8, for example, an insulating film IF2 including a silicon oxide film is formed in a region not covered with the protective film SN by thermal oxidation. In other words, the insulating film IF2 is formed on the semiconductor substrate SB of the region 1Aa. At this point, the other region is covered with the protective film SN and thus the insulating film IF2 is not formed in the region. The insulating film IF2 has a thickness of about 2 to 3 nm.

Subsequently, the semiconductor substrate SB is heat-treated in an atmosphere containing nitrogen, e.g., an atmosphere of NO or an atmosphere of N20. Hereinafter the step of heat treatment will be referred to as NO treatment. The NO treatment is conducted at about 900° C. for about 60 seconds. Through the NO treatment, nitrogen is introduced to the interface between the insulating film IF2 and the semiconductor substrate SB and the insulating film IF2 is partially nitrided in the region 1Aa. In FIG. 8, a point where nitrogen has been introduced on the insulating film IF2 is indicated as a nitrogen introduction point NO.

At this point, the other region is covered with the protective film SN and thus nitrogen is hardly introduced to the region. Specifically, nitrogen is hardly introduced to the interface between the insulating film IF1 and the semiconductor substrate SB in the region 1Ab, the interface between the insulating film IF1 and the semiconductor substrate SB in the region 2A, and the interface between the insulating film IF1 and the semiconductor layer SM in the region 3A. Even if nitrogen is introduced to these interfaces, the amount of nitrogen introduced to these interfaces is considerably smaller than the amount of nitrogen introduced to the interface between the insulating film IF2 and the semiconductor substrate SB in the region 1Aa. In other words, the amount of nitrogen introduced to these interfaces is smaller than the amount of nitrogen introduced to the interface between the insulating film IF2 and the semiconductor substrate SB in the region 1Aa.

Figure 9:
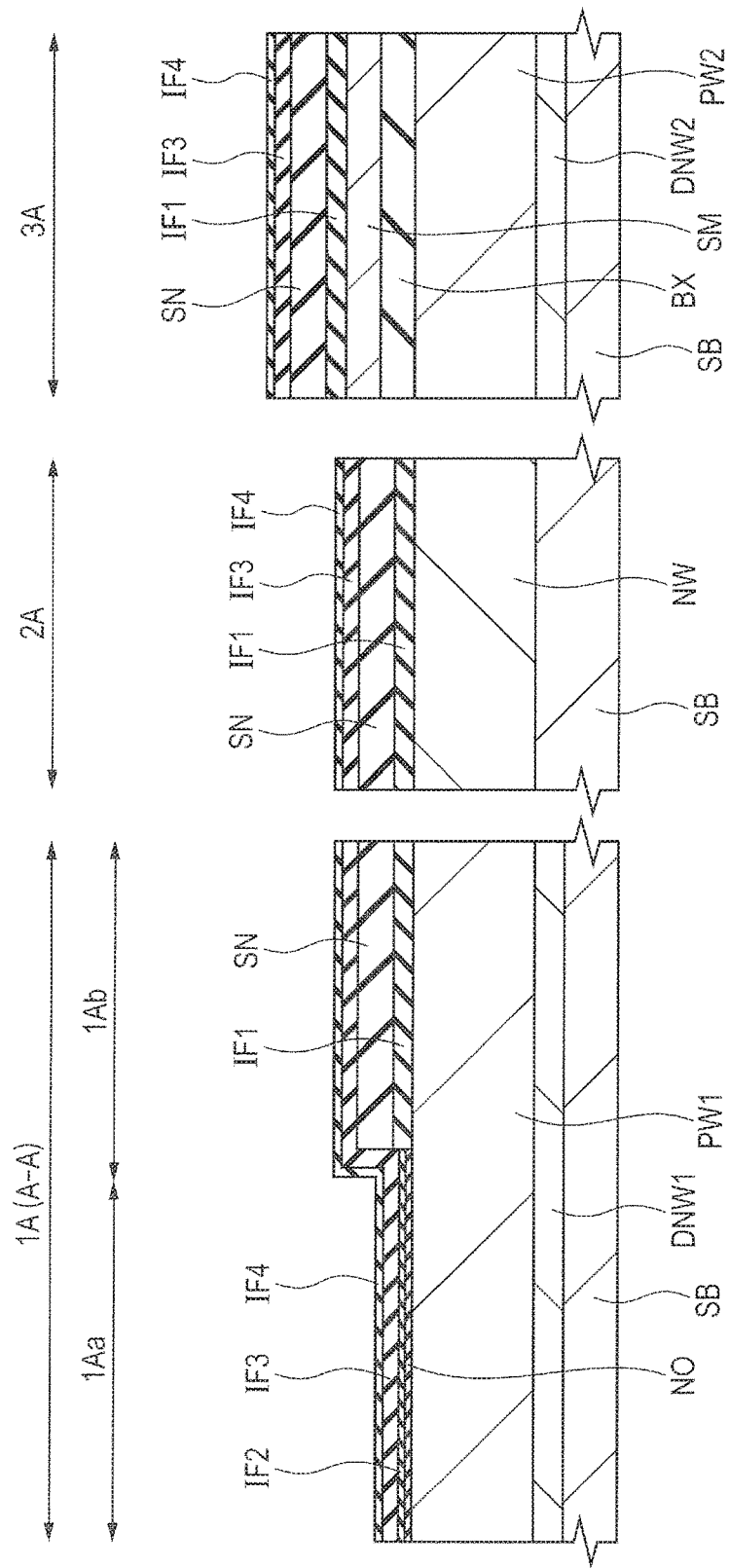
FIG. 9 is a cross-sectional view showing a manufacturing step of the semiconductor device after FIG. 8.

Subsequently, as shown in FIG. 9, an insulating film IF3 including, for example, a silicon nitride film is formed on the insulating film IF2 of the region 1Aa by, for example, CVD or ALD. At this point, the insulating film IF3 is formed on the protective film SN in the region 1Ab, the region 2A, and the region 3A. The insulating film IF3 has a thickness of about 5 to 10 nm. The insulating film IF3 serves as a charge storage layer CSL constituting a part of a gate insulating film GF1a of the memory transistor MTr. The insulating film IF3 is a trap insulating film where charge can be stored.

Then, an insulating film IF4 including, for example, a silicon oxide film is formed on the insulating film IF3 of the regions 1A to 3A by, for example, In-situ steam generation (ISSG) oxidation. The insulating film IF4 has a thickness of about 3 to 4 nm. The insulating film IF4 may be formed by CVD instead of ISSG oxidation.

Figure 10:
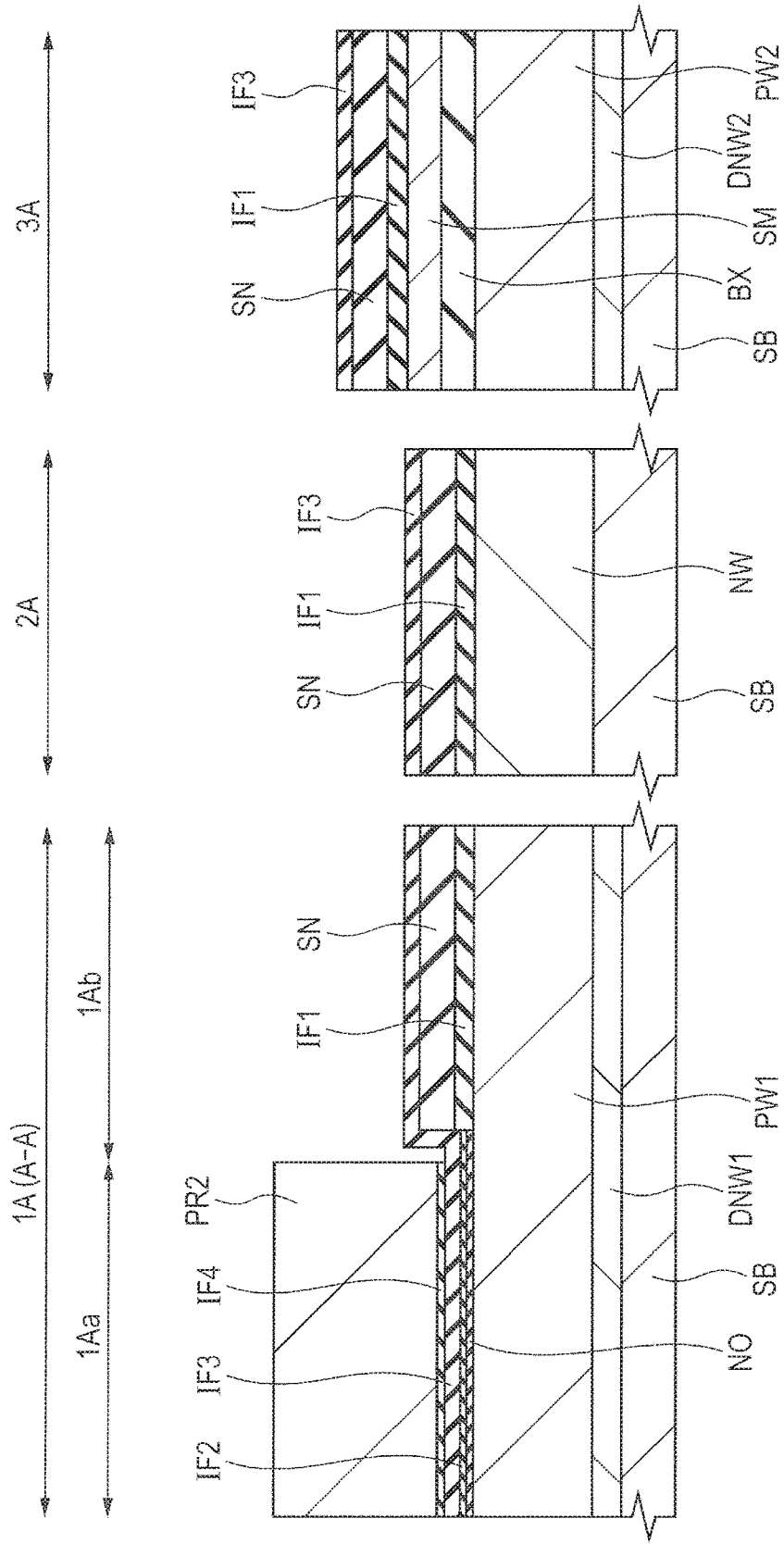
FIG. 10 is a cross-sectional view showing a manufacturing step of the semiconductor device after FIG. 9.

As shown in FIG. 10, a resist pattern PR2 is then formed so as to cover the region 1Ab and expose the region 1Ab, the region 2A, and the region 3A. Subsequently, etching is performed with the resist pattern PR2 serving as a mask, so that the insulating film IF4 exposed from the resist pattern PR2 is removed. This leaves the insulating film IF4 in the region 1Aa and exposes the insulating film IF3 in the other region. The resist pattern PR2 is then removed by asking.

Figure 11:
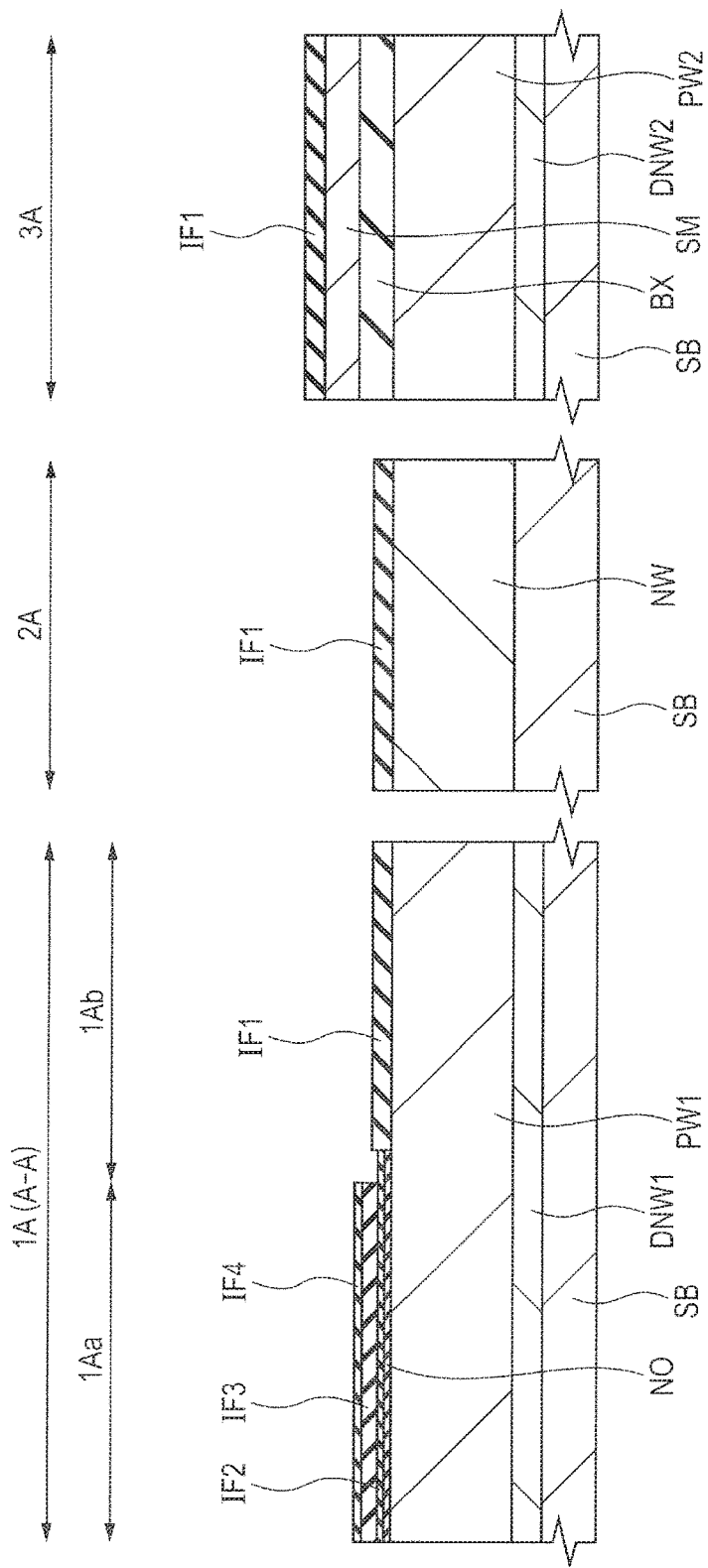
FIG. 11 is a cross-sectional view showing a manufacturing step of the semiconductor device after FIG. 10.

Then, as shown in FIG. 11, the insulating film IF3 and the protective film SN are removed in the region 1Ab, the region 2A, and the region 3A. The films are remove by, for example, wet etching with calcium phosphate on the conditions that the insulating film IF4 exposed in the region 1Aa is hardly etched. Thus, the insulating film IF4 can be left in the region 1Aa. The insulating film IF1 formed under the protective film SN acts as an etching stopper film in the region 1Ab, the region 2A, and the region 3A. In other words, after the removing step of FIG. 11, the insulating film IF1 is exposed in the region 1Ab, the region 2A, and the region 3A and the insulating film IF4 is exposed in the region 1Aa.

As illustrated in FIG. 6, the protective film SN is not limited to a silicon nitride film as long as the film has the function of preventing the introduction of nitrogen. Thus, other films such as a polysilicon film and a titanium nitride film may be used. In this case, in the removing step of FIG. 11, it is necessary to perform wet etching on the insulating film IF3 and then remove the protective film SN according to another etching method. This increases the number of steps in the manufacturing process. To address this problem, the protective film SN is made of the same material as the insulating film IF3. Thus, these films can be removed by a single wet etching operation, simplifying the manufacturing process.

In the present embodiment, in the region 1Aa, nitrogen is introduced to the interface between the insulating film IF2 and the semiconductor substrate SB through the manufacturing process illustrated in FIGS. 8 to 11. In contrast, nitrogen is hardly added to the interface between the insulating film IF1 and the semiconductor substrate SB in the region 1Ab and the region 2A and the interface between the insulating film IF1 and the semiconductor layer SM in the region 3A. Along with knowledge from the examination of the present inventors, the reason for the adjustment to the introduction of nitrogen in the regions will be described below.

First, in order to suppress an increase in manufacturing cost, the present inventors examined the formation of a gate electrode made up of a single-layer conductive film in the regions 1A to 3A. For example, in Japanese Unexamined Patent Application Publication No. 2015-118974 described in BACKGROUND, the gate electrode in the nonvolatile memory cell region and the gate electrodes in other regions are separately formed. This increases the number of steps in the manufacturing process.

It was found that if the gate electrode including a single-layer conductive film is formed in each of the regions 1A to 3A, problems occur due to NO treatment on the gate insulating film before the conductive film is formed as the gate electrode. The problems will be discussed below.

NO treatment is primarily performed to improve the charge storage characteristics of the memory transistor MTr formed in the region 1Aa. Specifically, in the memory transistor MTr, nitrogen is introduced to an insulating film X1 (insulating film IF2) between the semiconductor substrate SB and the charge storage layer CSL (insulating film IF3) so as to improve the charge storage characteristics of the memory transistor MTr. This can improve the retention characteristics of the memory cell MC.

However, the NO treatment is conducted over the semiconductor substrate SB and thus nitrogen is introduced not only to the gate insulating film of the memory transistor MTr of the region 1Aa but also to the gate insulating films of the transistors of other regions (e.g., the region 1Aa, the region 2A, and the region 3A). The study of the present inventors proved that threshold values fluctuate in n-type MISFETs such as the select transistor STr of the region 1Ab and the MISFET 2Q of the region 3A and negative bias temperature instability deteriorates in p-type MISFETs such as the MISFET 1Q of the region 2A. In other words, it was found that the introduction of nitrogen may reduce the reliability of the transistors in the regions.

In the present embodiment, the region 1Ab, the region 2A, and the region 3A are covered with the protective film SN during the NO treatment illustrated in FIG. 8, thereby suppressing the introduction of nitrogen in these regions.

Thus, the insulating films IF1 formed in the region 1Ab and the region 2A in FIG. 11 can be used as a gate insulating film GF1a of the select transistor STr and a gate insulating film GF2 of the MISFET 1Q. In the region 3A, the insulating film IF1 is removed in the subsequent step and thus the MISFET 2Q is hardly affected by the introduction of nitrogen.

As described above, in the present embodiment, nitrogen can be selectively introduced only to the region 1Aa. This can improve the charge storage characteristics of the memory transistor MTr and suppress fluctuations in threshold value in the n-type MISFET and deterioration of NBTI in the p-type MISFET in other regions.

<Explanation of a Study Example>

Figure 21:
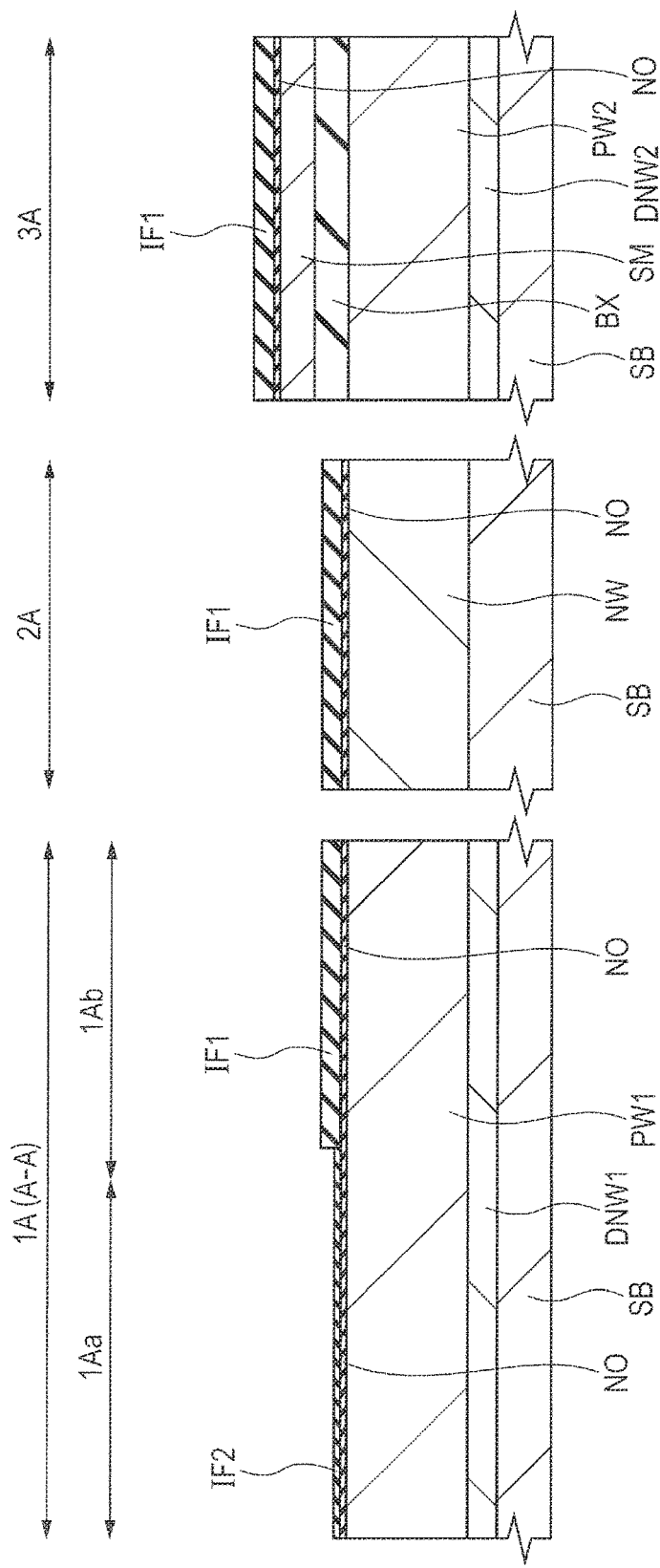
FIG. 21 is a cross-sectional view showing a manufacturing step of a semiconductor device according to an examination example.
Figure 22:
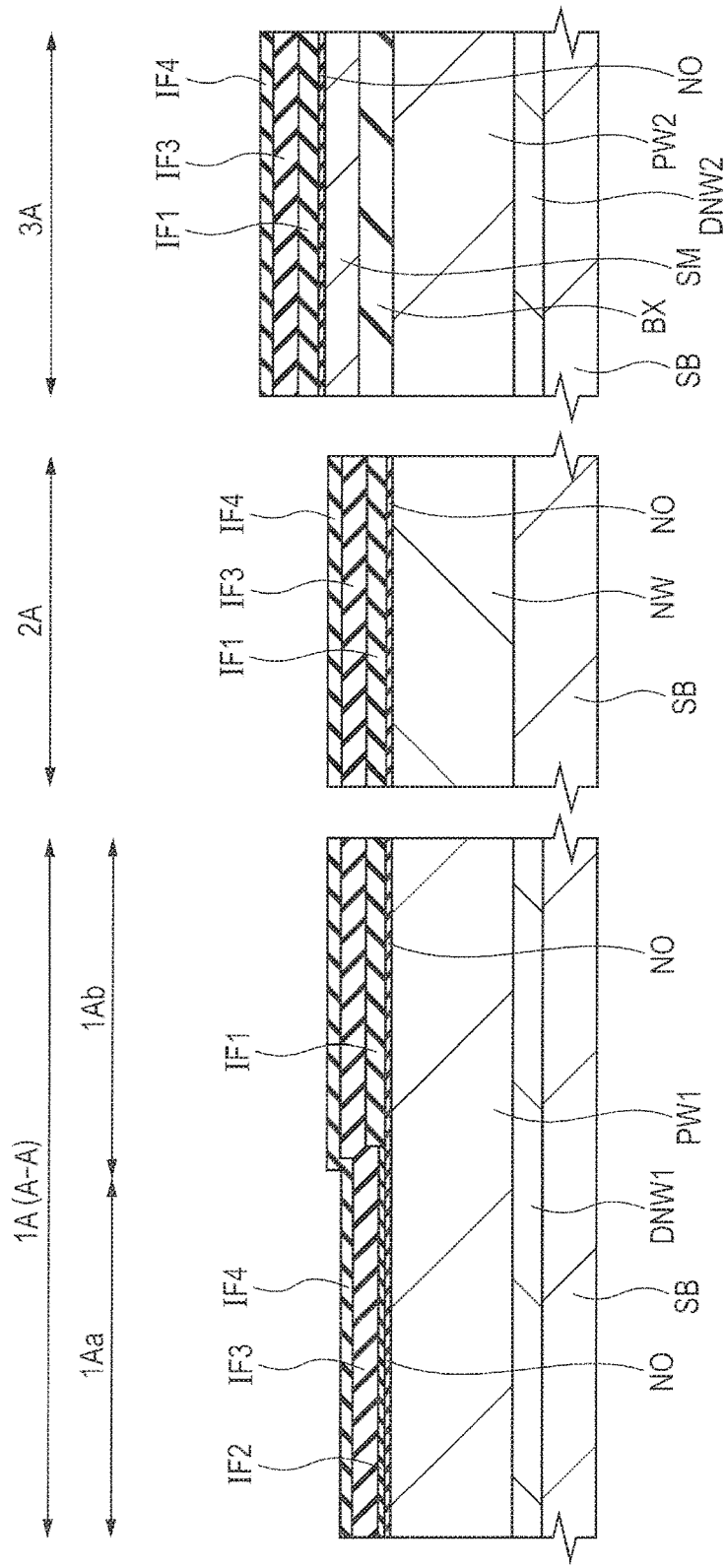
FIG. 22 is a cross-sectional view showing a manufacturing step of the semiconductor device after FIG. 21.

FIGS. 21 to 23 show a study example of the present inventors. FIGS. 21 to 23 are equivalent to the steps illustrated in FIGS. 8 to 11 of the present embodiment. The examination example is different from the present embodiment in that NO treatment is performed without forming the protective film SN.

FIG. 21 is a cross-sectional view following the step of FIG. 7 of the present embodiment. Unlike in FIG. 8 of the present embodiment, the protective film SN is not formed. Specifically, in FIG. 21, the insulating film IF2 is exposed in the region 1Aa and the insulating film IF1 is formed in the region 1Ab, the region 2A, and the region 3A, whereas the protective film SN is not formed on the insulating film IF1 of the region 1Ab, the region 2A, and the region 3A. In the study example, NO treatment is performed in the absence of the protective film SN. Thus, nitrogen is also introduced to the interface between the insulating film IF1 and the semiconductor substrate SB in the region 1Ab and in the region 2A and the interface between the insulating film IF1 and the semiconductor layer SM in the region 3A as well as the interface between the insulating film IF2 and the semiconductor layer SB in the region 1Aa. In FIG. 21, a point where nitrogen is introduced is indicated as a nitrogen introduction point NO.

Subsequently, as shown in FIG. 22, the insulating film IF3 including, for example, a silicon nitride film is formed on the insulating film IF2 of the region 1Aa by, for example, CVD or ALD. At this point, the insulating film IF3 is formed on the insulating film IF1 in the region 1Ab, the region 2A, and the region 3A. Then, the insulating film IF4 including, for example, a silicon oxide film is formed on the insulating film IF3 of the regions 1A to 3A by, for example, ISSG oxidation.

Subsequently, as shown in FIG. 23, the insulating film IF4 is removed in other regions so as to selectively leave the insulating film IF4 in the region 1Aa according to photolithography and etching.

The insulating film IF3 is then removed in the region 1Ab, the region 2A, and the region 3A. Thus, the insulating film IF1 is removed in the region 1Ab, the region 2A, and the region 3A and the insulating film IF4 is exposed in the region 1Aa.

In this way, in the study example, nitrogen is also introduced to the interface between the insulating film IF1 and the semiconductor substrate SB in the region 1Ab and the region 2A and the interface between the insulating film IF1 and the semiconductor layer SM in the region 3A as well as the interface between the insulating film IF2 and the semiconductor layer SB in the region 1Aa after the step of FIG. 23. Hence, if the insulating film IF1 where nitrogen has been introduced is used as the gate insulating film, the study example cannot solve the problems of fluctuations in threshold value in the n-type MISFET and deterioration of NBTI in the p-type MISFET.

In contrast, in the present embodiment, NO treatment is performed in a state where the region 1Ab, the region 2A, and the region 3A are covered with the protective film SN as illustrated in FIG. 8. Thus, unlike in the study example, the introduction of nitrogen can be suppressed in the regions according to the present embodiment.

The explanation of the study example is completed.

Figure 12:
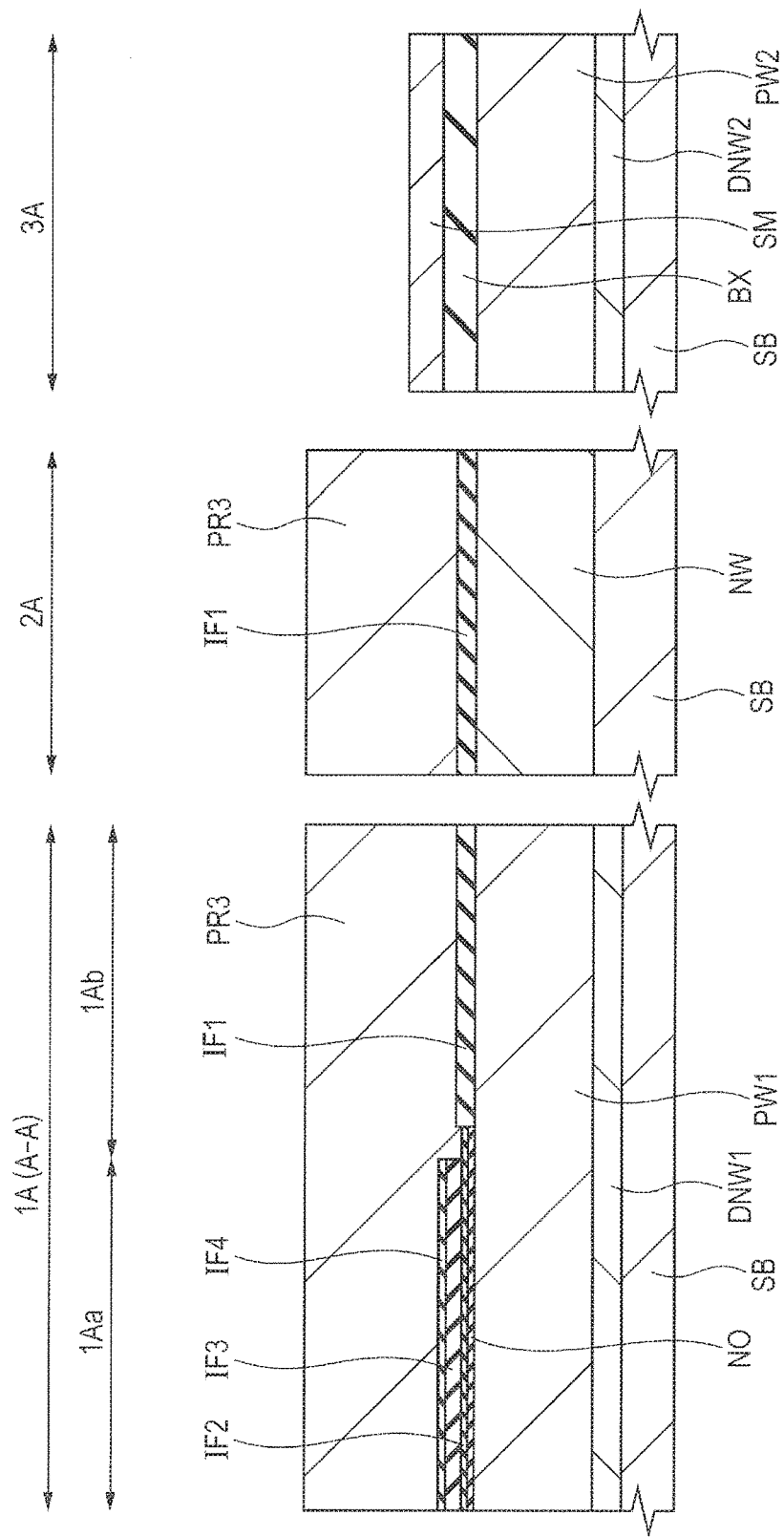
FIG. 12 is a cross-sectional view showing a manufacturing step of the semiconductor device after FIG. 11.

FIG. 12 shows a manufacturing step after FIG. 11 according to the present embodiment.

As shown in FIG. 12, a resist pattern PR3 is formed so as to cover the region 1A and the region 2A and expose the region 3A. Subsequently, wet etching is performed using hydrogen fluoride or the like with the resist pattern PR3 serving as a mask, so that the insulating film IF1 is removed and the semiconductor layer SM is exposed in the region 3A. The resist pattern PR3 is then removed by asking.

Figure 13:
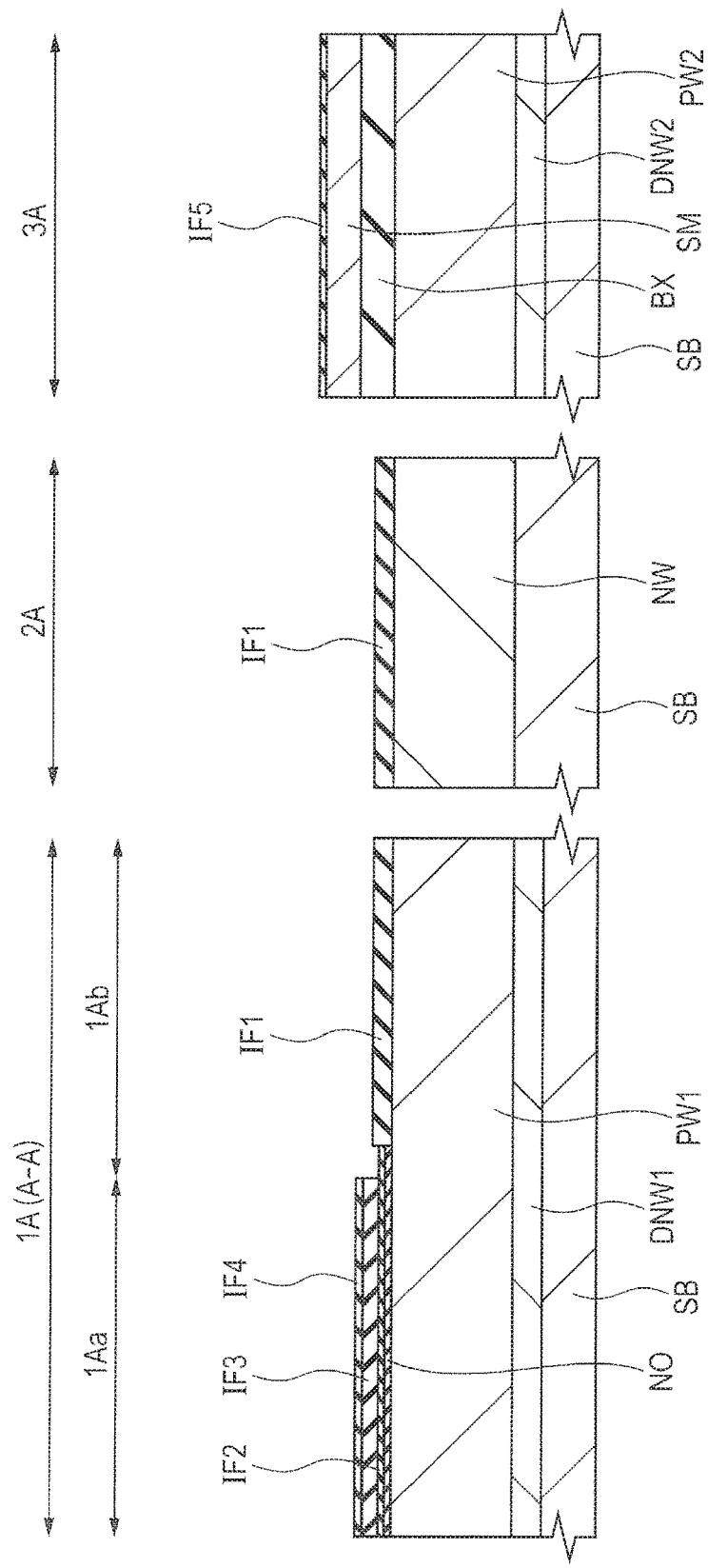
FIG. 13 is a cross-sectional view showing a manufacturing step of the semiconductor device after FIG. 12.

Subsequently, as shown in FIG. 13, an insulating film IF5 including, for example, a silicon oxide film is formed on the semiconductor layer SM of the region 3A by thermal oxidation. The insulating film IF5 is formed into a gate insulating film GF3 of the MISFET 2Q in a subsequent step. The insulating film IF5 has a thickness of about 2 to 3 nm.

In the region 3A, the insulating film IF1 has been formed at the time of NO treatment shown in FIG. 8. However, the insulating film IF1 of the region 3A is removed in the step of FIG. 12, and the insulating film IF5 is additionally formed in the region 3A in the step of FIG. 13. Thus, even if a small amount of nitrogen is introduced to the interface between the insulating film IF1 and the semiconductor layer SM in the region 3A by the NO treatment of FIG. 8, the nitrogen introduced to the interface is removed with the insulating film IF1 in the step of FIG. 12. This can further reduce the probability of a change in the characteristics of the MISFET 2Q.

The MISFET 2Q formed in the region 3A is a transistor formed on the SOI substrate and a fully depleted type called silicon-on-thin-buried oxide (SOTB). Such a transistor is driven at an ultralow voltage of about 0.75 V. In order to suppress threshold value fluctuations caused by uneven impurities, ions for adjusting a threshold value are not implanted to the semiconductor layer SM serving as a channel region. In other words, the semiconductor layer SM is an intrinsic semiconductor layer where an n-type or p-type impurity is not introduced by ion implantation or the like. Even if p-type impurity is introduced into the semiconductor layer SM, the concentration of the impurity is $1 \times 10^{13}/cm^3$ or less. Thus, as compared with the high voltage MISFET formed in the region 1Ab and the region 2A, the MISFET 2Q formed in the region 3A is considerably affected by threshold value fluctuations caused by the introduction of nitrogen. For this reason, it is desirable to further reduce the possibility of leaving even a small amount of nitrogen on the interface between the insulating film IF5 and the semiconductor layer SM in the region 3A.

Hence, in the present embodiment, the insulating film IF1 is first formed as the gate insulating film of the MISFET 1Q in the region 2A, the insulating film IF1 in the region 3A is removed, and then the insulating film IF5 is formed as the gate insulating film of the MISFET 2Q in the region 3A. During NO treatment, the insulating film IF5 is not formed in the region 3A.

In other words, technically, the insulating film IF2 can be formed in the region 1Aa in FIG. 8, and then the insulating film IF5 can be formed in the region 3A before NO treatment. Also in this case, the insulating film IF5 of the region 3A is covered with the protective film SN and thus nitrogen is hardly introduced to the insulating film IF5. However, nitrogen may be slightly introduced to the insulating film IF5. As described above, the MISFET 2Q is considerably affected by the introduction of nitrogen. For this reason, it is desirable to further reduce the possibility of introducing even a small amount of nitrogen to the interface between the insulating film IF5 and the semiconductor layer SM in the region 3A. Thus, as in the present embodiment, it is more preferable that the insulating film IF5 serving as the gate insulating film of the MISFET 2Q is not formed during NO treatment.

Figure 14:
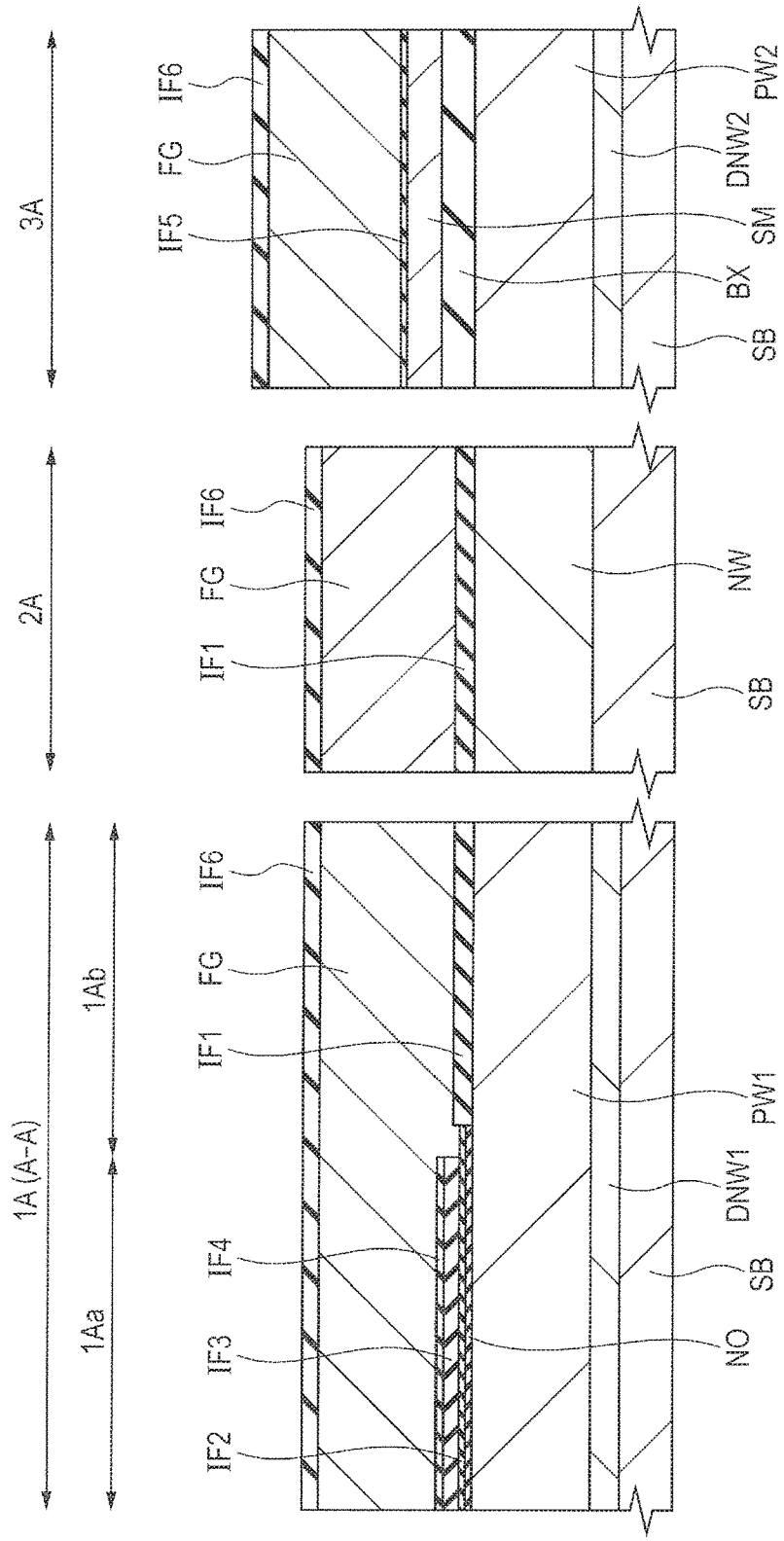
FIG. 14 is a cross-sectional view showing a manufacturing step of the semiconductor device after FIG. 13.

Before a conductive film FG is formed for each of the gate electrodes in FIG. 14 after the formation of the insulating film IF5 of FIG. 13, plasma treatment may be performed over the regions 1A to 3A in an atmosphere containing, for example, nitrogen. The plasma treatment nitrides the surface of the insulating film IF4 in the region 1Aa, the surface of the insulating film IF1 in the region 1Ab and the region 2A, and the surface of the insulating film IF5 in the region 3A. Unlike in nitriding through NO treatment, the nitriding trough the plasma treatment nitrides only the vicinity of the surface of the insulating film but hardly nitrides the interface between the insulating film and the semiconductor substrate SB. In other words, an upper half of the thickness of the insulating film has a higher nitrogen concentration than a lower half of the thickness of the insulating film.

The plasma treatment can achieve the following effects: For example, impurity introduced into the gate electrode can be prevented from being diffused to the semiconductor substrate SB. In the case of a p-type transistor, a p-type impurity, e.g., boron (B) introduced to the gate electrode can be prevented from being diffused from the inside of the gate electrode to the semiconductor substrate SB by heat treatment in the manufacturing steps. Moreover, the dielectric constant of the gate insulating film can be improved. For example, if the gate insulating film is a silicon oxide film, the upper part of the silicon oxide film can be a silicon-oxynitride film having a high dielectric constant. Thus, the electrical thickness of the gate insulating film can be reduced with a fixed large physical thickness.

FIG. 14 shows a manufacturing step after FIG. 13 according to the present embodiment. FIG. 14 shows the step of forming the conductive film FG for the gate electrodes and an insulating film IF6 for a cap film.

For example, a polysilicon film is first deposited by, for example, CVD as the conductive film FG for the gate electrodes so as to cover the regions 1A to 3A. Subsequently, an impurity is introduced to the conductive film FG in each of the regions according to photolithography and ion implantation. In this case, an n-type impurity is introduced to the conductive film FG in the region 1A and the region 3A, whereas a p-type impurity is introduced to the conductive film FG in the region 2A. Then, for example, a silicon nitride film is deposited by CVD on the conductive film FG, as the insulating film IF6 for the cap film on the gate electrode. The conductive film FG constituting the gate electrode is not limited to the polysilicon film and thus may be a metal film or a laminated film of a polysilicon film and a metal film.

Figure 15:
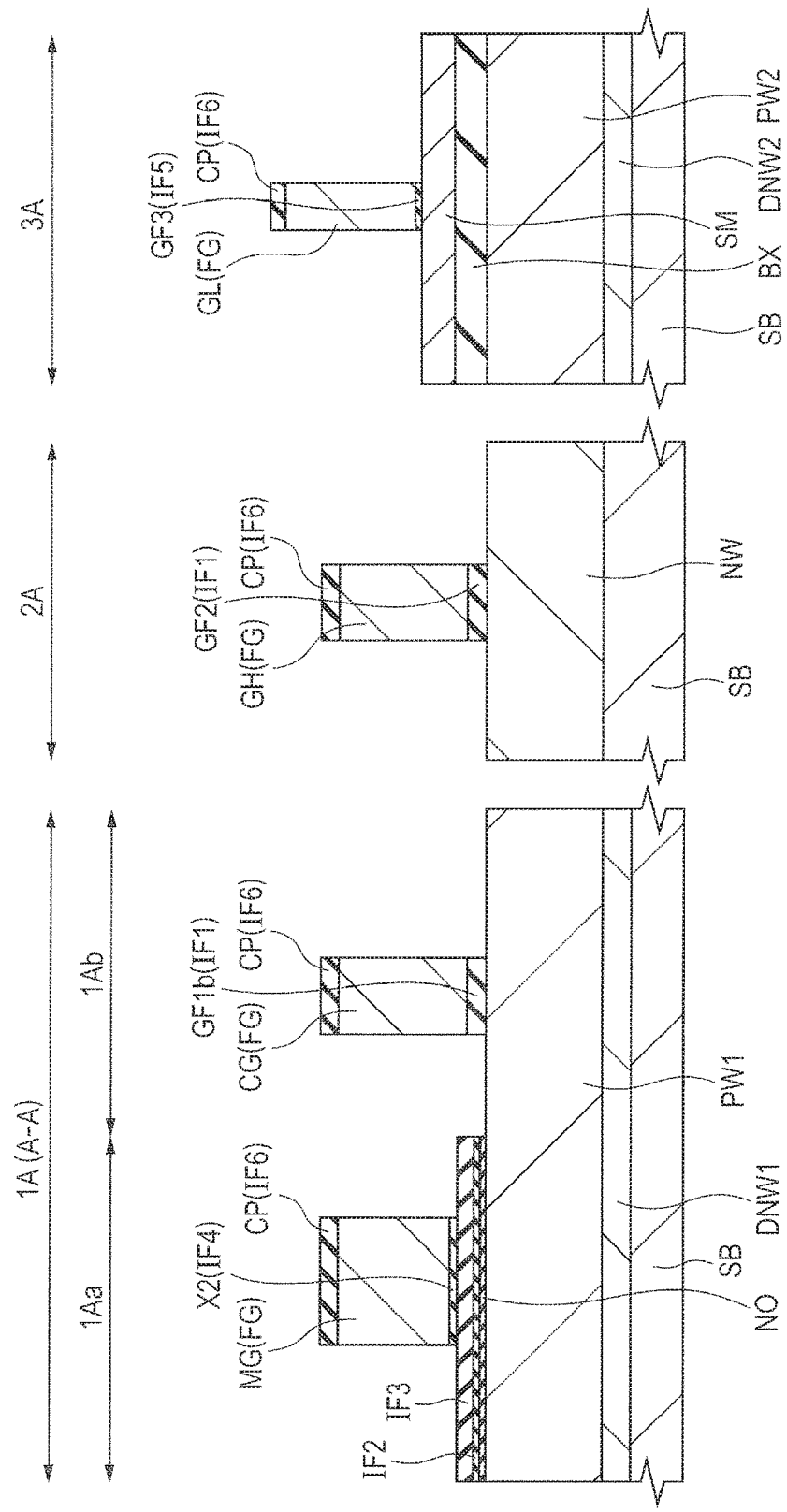
FIG. 15 is a cross-sectional view showing a manufacturing step of the semiconductor device after FIG. 14.

Subsequently, as shown in FIG. 15, the insulating film IF6 and the conductive film FG are patterned according to photolithography and dry etching. This forms a memory gate electrode MG in the region 1Aa, a control gate electrode CG in the region 1Ab, a gate electrode GH in the region 2A, and a gate electrode GL in the region 3A. Moreover, a cap film CP is formed on each of the gate electrodes. Then, the insulating film exposed from the gate electrodes is removed so as to form an insulating film X2 as a part of the gate insulating film GF1a under the memory gate electrode MG of the region 1Aa, a gate insulating film GF1b under the control gate electrode CG of the region 1Ab, the gate insulating film GF2 under the gate electrode GH of the region 2A, and the gate insulating film GF3 under the gate electrode GL of the region 3A.

Figure 16:
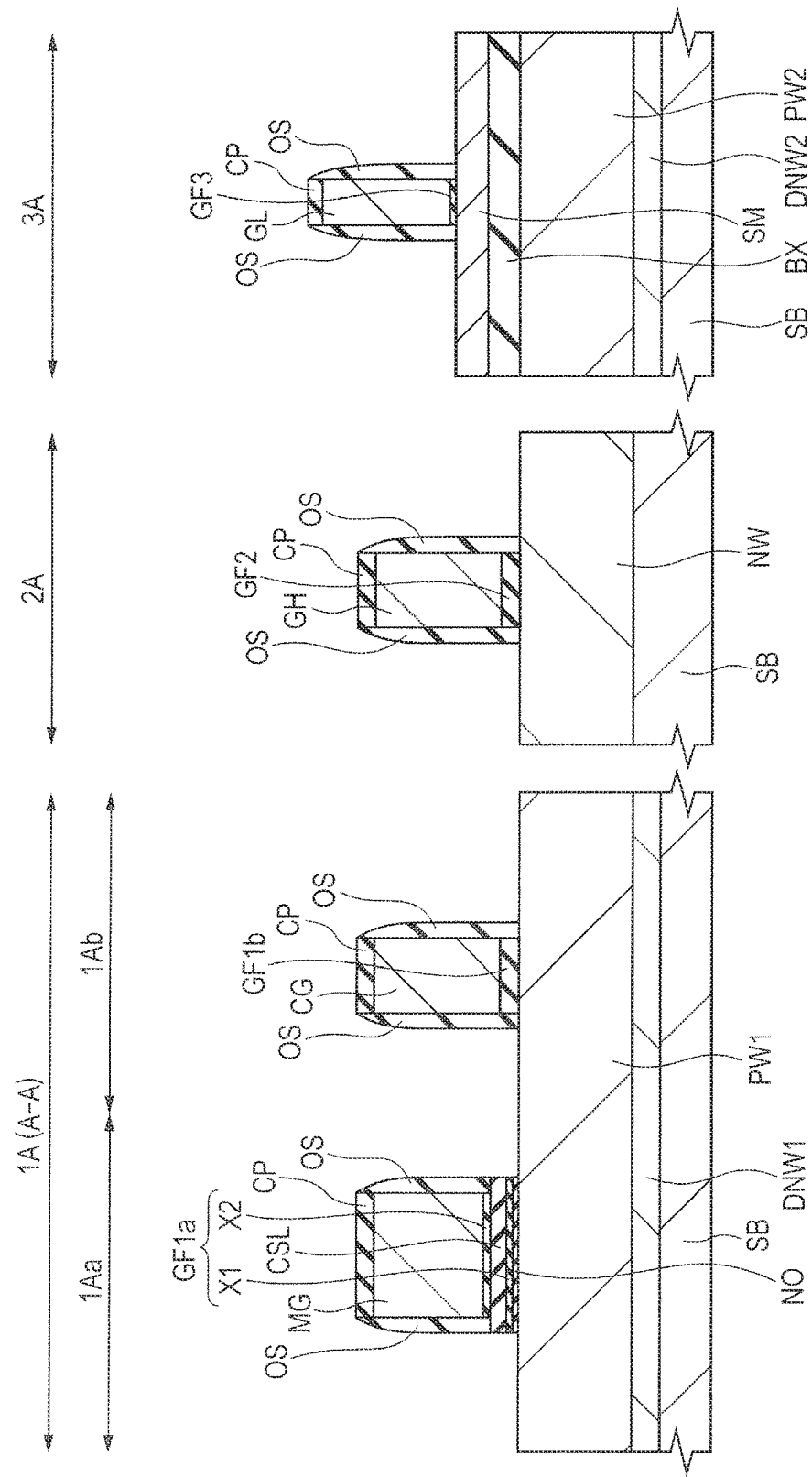
FIG. 16 is a cross-sectional view showing a manufacturing step of the semiconductor device after FIG. 15.

FIG. 16 shows the step of manufacturing offset spacers OS.

First, an insulating film including, for example, a silicon oxide film is formed by, for example, CVD so as to cover the regions 1A to 3A. Then, anisotropic etching is performed on the insulating film so as to form the offset spacers OS on the sides of the memory gate electrode MG, the control gate electrode CG, the gate electrode GH, and the gate electrode GL. At this point, in the region 1Aa, anisotropic etching is continued so as to remove the insulating film IF3 and the insulating film IF2 that are exposed from the offset spacers OS. This forms the gate insulating film GF1a including the insulating film X1, the charge storage layer CSL, and the insulating film X2 under the memory gate electrode MG.

Figure 17:
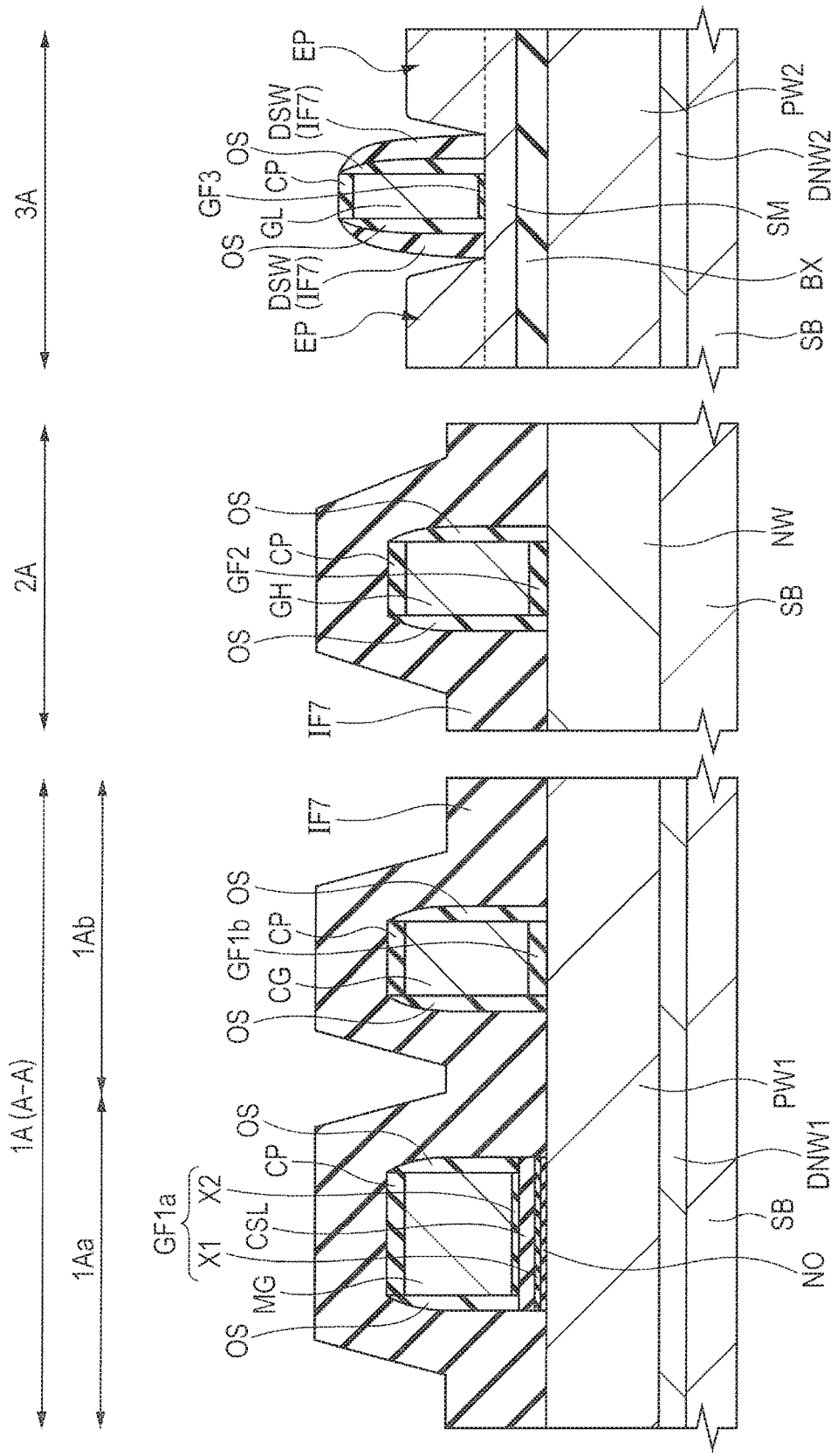
FIG. 17 is a cross-sectional view showing a manufacturing step of the semiconductor device after FIG. 16.

FIG. 17 shows the step of forming a dummy side-wall spacer DSW and an epitaxial layer EP in the region 3A.

First, an insulating film IF7 including, for example, a silicon nitride film is formed by, for example, CVD so as to cover the regions 1A to 3A. Subsequently, the insulating film IF7 of the region 3A is treated by anisotropic etching with a resist pattern (not shown) serving as a mask selectively covering the insulating film IF7 of the region 1A and the region 2A. This forms the dummy side-wall spacer DSW on the sides of the gate electrode GL with the offset spacer OS interposed between the gate electrode GL and the dummy side-wall spacer DSW. The resist pattern is then removed by asking.

Thereafter, an epitaxial layer EP (semiconductor layer EP) made of, for example, single-crystal silicon is formed on the semiconductor layer SM of the region 3A by epitaxial growth. The semiconductor layer EP has a thickness of about 20 to 40 nm. At this point, the gate electrode GL of the region 3A is covered with the cap film CP, so that the epitaxial layer EP is not formed on the gate electrode GL. Since the region 1A and the region 2A are covered with the insulating film IF7, the epitaxial layer EP is not formed in the regions.

It is desirable to epitaxially grow the semiconductor layer SM in a state where an impurity is not introduced by ion implantation or the like, for example, before the formation of an extension region EX, which will be discussed later.

This is because if the epitaxial layer EP is formed on the semiconductor layer SM damaged by the step of ion implantation, the damage may cause variations in the crystallinity of silicon making up the semiconductor layer SM, thereby precluding proper growth of the epitaxial layer EP. Thus, the epitaxial layer EP may not be formed with a desired thickness and shape. For this reason, the epitaxial layer EP is formed before the formation of the extension region EX in the semiconductor device of the present embodiment.

The epitaxial layer EP is made of the same material as the semiconductor layer SM and thus is integrated with the semiconductor layer SM. In the present embodiment, the boundary between the epitaxial layer EP and the semiconductor layer SM is indicated by a broken line to enhance understanding of the invention. In the subsequent step, a diffusion region D3 is formed in the epitaxial layer EP and the semiconductor layer SM. At this point, the epitaxial layer EP is quite indistinct and thus is indicated by an arrow in FIG. 17.

Figure 18:
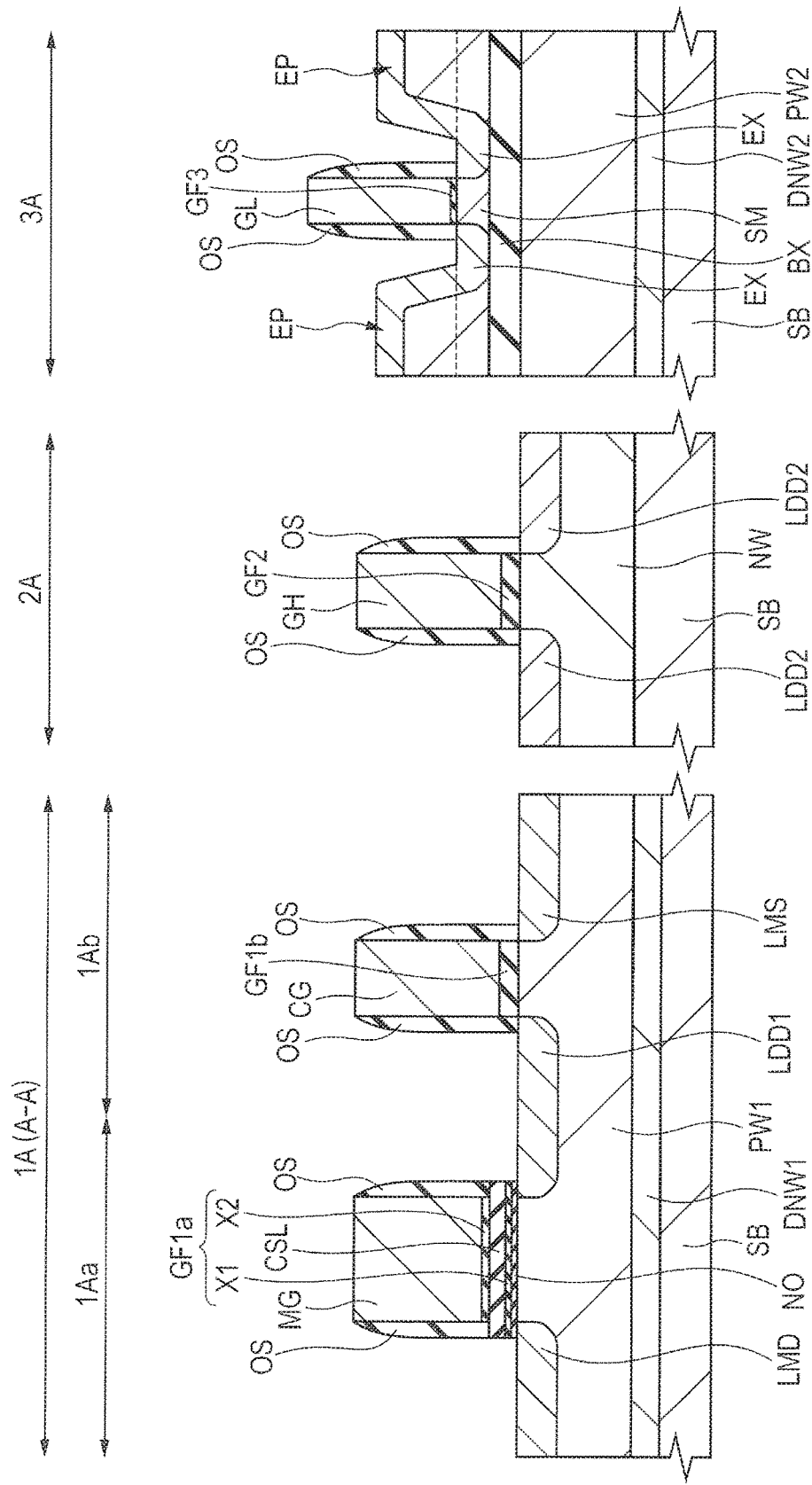
FIG. 18 is a cross-sectional view showing a manufacturing step of the semiconductor device after FIG. 17.

Subsequently, as shown in FIG. 18, etching is performed on the conditions that the offset spacers OS are hardly etched. This removes the dummy side-wall spacer DSW and the cap film CP in the region 3A and removes the insulating film IF7 and the cap film CP in the region 1A and the region 2A. The dummy side-wall spacer DSW, the insulating film IF7, and the cap insulating film CP are made of the same material and thus can be removed at the same time. This eliminates the need for an additional mask, thereby simplifying the manufacturing process.

Thereafter, an impurity region is formed in each of the regions 1A to 3A according to photolithography and ion implantation.

In the region 1A, n-type impurity regions LMS, LDD1, and LMD are formed. The impurity region LMS constitutes apart of the source region of the memory cell MC and is formed on one side of the control gate electrode CG, on the semiconductor substrate SB. The impurity region LDD1 is a region electrically coupling the select transistor STr and the memory transistor MTr. The impurity region LDD1 is formed on the semiconductor substrate SB so as to be located between the other side of the control gate electrode CG and one side of the memory gate electrode MG. The impurity region LMS constitutes a part of the drain region of the memory cell MC and is formed on the other side of the memory gate electrode CG, on the semiconductor substrate SB.

In the region 2A, two p-type impurity regions LDD2 are formed. The two impurity regions LDD2 constitute a part of the source region of the MISFET 1Q and a part of the drain region of the MISFET 1Q, respectively, and are formed on the respective sides of the gate electrode GH, on the semiconductor substrate SB.

In the region 3A, two n-type extension regions (impurity regions) EX are formed. The two extension regions EX constitute a part of the source region of the MISFET 2Q and a part of the drain region of the MISFET 2Q, respectively, and are formed on the respective sides of the gate electrode GL, on the semiconductor layer SM and the epitaxial layer EP.

Figure 19:
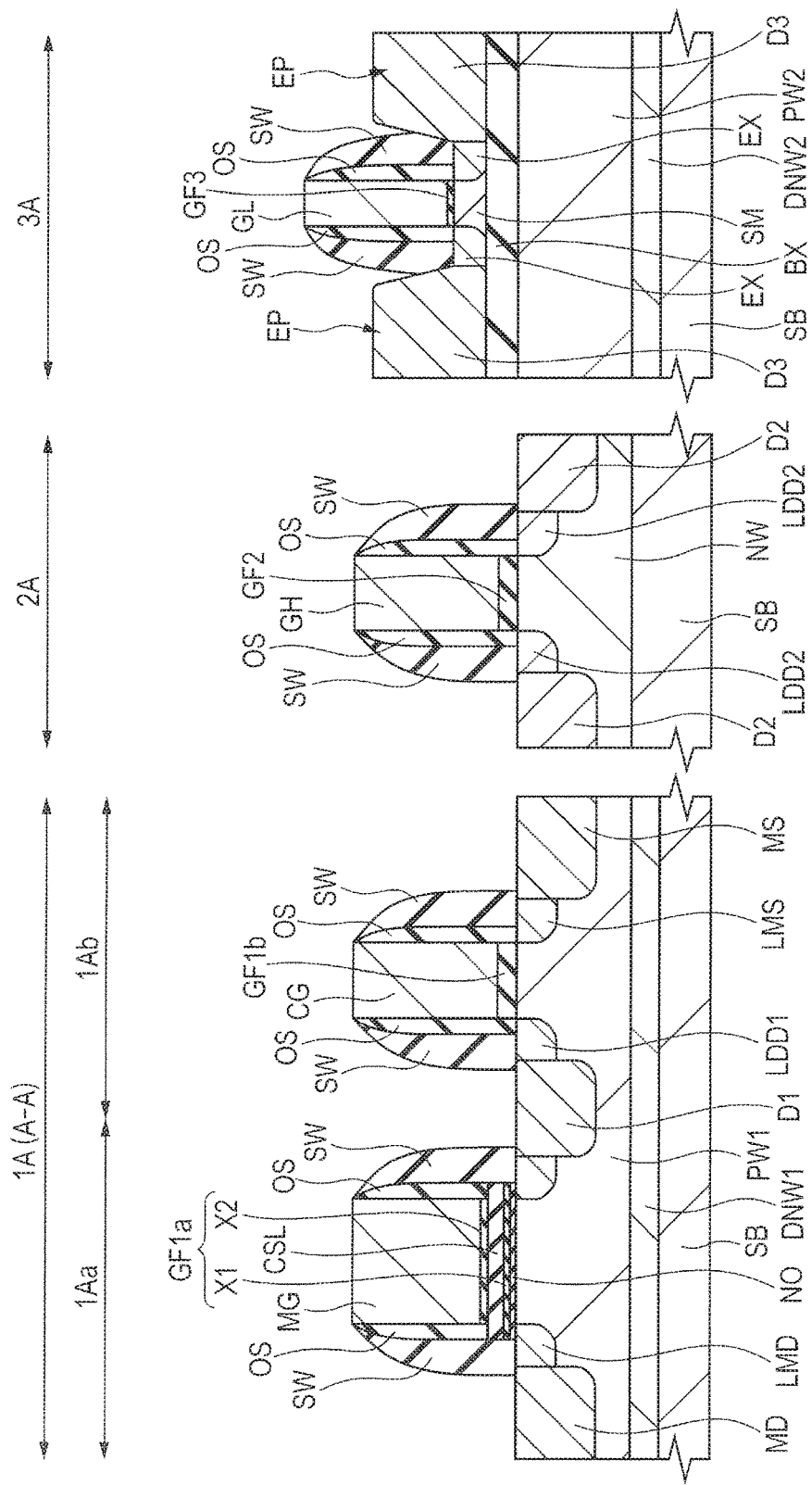
FIG. 19 is a cross-sectional view showing a manufacturing step of the semiconductor device after FIG. 18.

FIG. 19 shows the step of forming side wall spacers SW and diffusion regions in the regions 1A to 3A.

First, an insulating film including, for example, a silicon nitride film is formed by, for example, CVD so as to cover the regions 1A to 3A. Then, the insulating film is anisotropically etched so as to form the side wall spacers SW on the sides of the memory gate electrode MG, the control gate electrode CG, the gate electrode GH, and the gate electrode GL, the offset spacer OS being interposed between the side wall spacer and the gate electrode.

Subsequently, the diffusion regions MS and MD and a diffusion region D1 are formed in the region 1A, a diffusion region D2 is formed in the region 2A, and a diffusion region D3 is formed in the region 3A according to photolithography and ion implantation.

In the region 1A, the n-type diffusion regions MS, D1, and MD are exposed from the side wall spacers SW and are formed on the semiconductor substrate SB having the impurity regions LMS, LDD1, and LMD. The diffusion regions have higher impurity concentrations than the impurity regions LMS, LDD1, and LMD. The diffusion region MS is coupled to the impurity region LMS and constitutes a part of the source region of the memory cell MC. The impurity region MD is coupled to the impurity region LMD and constitutes a part of the drain region of the memory cell MC.

In the region 2A, the p-type diffusion D2 are exposed from the side wall spacers SW and are formed on the semiconductor substrate SB having the impurity region LDD2. The diffusion region D2 has a higher impurity concentration than the impurity region LDD2. The diffusion region D2 is coupled to the impurity region LDD2 and constitutes a part of the source region of the MISFET 1Q and a part of the drain region of the MISFET 1Q.

In the region 3A, the n-type diffusions D3 are each formed on the epitaxial layer EP exposed from the side wall spacer SW and on the semiconductor layer SM. The diffusion region D3 has a higher impurity concentration than the extension region EX. The diffusion region D3 is coupled to the extension region EX and constitutes a part of the source region of the MISFET 2Q and a part of the drain region of the MISFET 2Q.

FIG. 20 shows the step of forming a silicide layer SI, plugs PG, and wires M1 in the regions 1A to 3A.

First, the low-resistance silicide layer SI is formed on the top surfaces of the diffusion regions MD, MS, and D1 to D3, the memory gate electrode MG, the control gate electrode CG, the gate electrode GH, and the gate electrode GL according to the self-aligned silicide (Salicide) process.

Specifically, the silicide layer SI can be formed as follows: First, a metal film for forming the silicide layer SI is formed so as to cover the regions 1A to 3A. The metal film is composed of, for example, cobalt, nickel, or a nickel-platinum alloy. Then, the semiconductor substrate SB is heat-treated so as to react the diffusion regions MD, MS, and D1 to D3, the memory gate electrode MG, the control gate electrode CG, the gate electrode GH, and the gate electrode GL with the metal film. This forms the silicide layer SI on the top surfaces of the diffusion regions MD, MS, and D1 to D3, the memory gate electrode MG, the control gate electrode CG, the gate electrode GH, and the gate electrode GL. Then, the unreacted metal film is removed. The formation of the silicide layer SI can reduce a diffusion resistance and a contact resistance on the diffusion regions MD, MS, and D1 to D3, the memory gate electrode MG, the control gate electrode CG, the gate electrode GH, and the gate electrode GL.

This forms the memory transistor MTr in the region 1Aa, the select transistor STr in the region 1Ab, the MISFET 1Q in the region 2A, and the MISFET 2Q in the region 3A.

Subsequently, in the regions 1A to 3A, an interlayer insulating film IL1 is formed so as to cover the memory transistor MTr, the select transistor STr, the MISFET 1Q, and the MISFET 2Q. The interlayer insulating film IL1 may be a silicon oxide film or a laminated film of a silicon nitride film and a silicon oxide film. After the formation of the interlayer insulating film IL1, the top surface of the interlayer insulating film IL1 can be polished by chemical mechanical polishing (CMP).

Subsequently, contact holes are formed in the interlayer insulating film IL1 according to, for example, photolithography and dry etching, and then the contact holes are filled with a conductive film primarily made of tungsten (W). This forms the plugs PG in the interlayer insulating film IL1. The plugs PG formed in the regions 1A to 3A are coupled to the diffusion regions MD, MS, D2, and D3 via the silicide layers SI.

Then, an interlayer insulating film IL2 is formed on the interlayer insulating film IL1 where the plugs PG are embedded. Thereafter, wire grooves are formed on the interlayer insulating film L2 and then are filled with a conductive film primarily made of copper. This forms the wires M1 coupled to the plugs PG in the interlayer insulating film IL2. The structure of the wires M1 is called a Damascene wire structure.

The subsequent layers of wires are formed by, for example, the Dual Damascene process. The illustration and explanation thereof are omitted. Moreover, the wires M1 and wires above the wire M1 are not limited to the Damascene wire structure and can be formed by patterning a conductive film. For example, tungsten or aluminum wires may be used instead.

The semiconductor device of the present embodiment is manufactured thus.

The invention made by the present inventors was specifically described in accordance with the foregoing embodiment. Obviously, the present invention is not limited to the embodiment and various changes can be made within the scope of the invention.

For example, in the present embodiment, the low-voltage MISFET formed in the region 3A is the MISFET 2Q, a fully depleted transistor that is called SOTB and is formed on the SOI substrate. However, the low-voltage MISFET formed in the region 3A may be formed on the semiconductor substrate SB (bulk substrate) not including the insulating layer BX and the semiconductor layer SM, instead of the SOI substrate.

What is claimed is:

1. A method of manufacturing a semiconductor device including a first region where a first MISFET is to be formed and a second region where a second MISFET is to be formed, comprising the steps of:
   (a) forming a first insulating film over a semiconductor substrate of the first region and the second region;
   (b) forming a protective film on the first insulating film, the protective film being made of a different material from the first insulating film;
   (c) exposing the semiconductor substrate of the first region by selectively removing the protective film and the first insulating film of the first region;
   (d) after the step (c), forming a second insulating film on the semiconductor substrate of the first region;
   (e) after the step (d), introducing nitrogen to an interface between the semiconductor substrate and the second insulating film in the first region by performing a heat treatment on the semiconductor substrate in an atmosphere containing nitrogen in a state where the first insulating film in the second region is covered with the protective film;
   (f) after the step (e), removing the protective film of the second region;
   (g) after the step (f), forming a first conductive film over the second insulating film of the first region and over the first insulating film of the second region, and
   (h) forming a first gate electrode of the first MISFET in the first region and a second gate electrode of the second MISFET in the second region by patterning the first conductive film.

2. The method of manufacturing a semiconductor device according to claim 1, further comprising the steps of:
   (i) after the step (e) and before the step (f), forming a third insulating film on the second insulating film of the first region and on the protective film of the second region; and
   (j) forming a fourth insulating film on the third insulating film; and
   (k) after the step (j), selectively removing the fourth insulating film and the third insulating film of the second region so as to leave the fourth insulating film and the third insulating film of the first region,
   wherein in the step (g), the first conductive film of the first region is formed on the fourth insulating film,
   wherein in the step (h), the first gate electrode of the first region is formed on the fourth insulating film, and
   wherein a first gate insulating film of the first MISFET includes the second insulating film, the third insulating film, and the fourth insulating film of the first region.

3. The method of manufacturing a semiconductor device according to claim 2,
   wherein the third insulating film and the protective film are made of the same material, and
   wherein the third insulating film is removed in the step (k) by etching and the protective film is removed in the step (f) by similar etching.

4. The method of manufacturing a semiconductor device according to claim 2, further comprising the step of:
   after the step (f) and before the step (g), performing plasma treatment on a surface of the fourth insulating film of the first region and a surface of the first insulating film of the second region in an atmosphere containing nitrogen.

5. The method of manufacturing a semiconductor device according to claim 2,
   wherein the third insulating film is a charge storage layer, and
   wherein the first MISFET constitutes a part of a nonvolatile memory cell.

6. The method of manufacturing a semiconductor device according to claim 5,
   wherein the third insulating film includes a silicon nitride film, and
   wherein the second insulating film and the fourth insulating film each include a silicon oxide film.

7. The method of manufacturing a semiconductor device according to claim 5,
   wherein the nonvolatile memory cell includes the first MISFET and the second MISFET, and
   wherein the second MISFET constitutes a select transistor of the nonvolatile memory cell.

8. The method of manufacturing a semiconductor device according to claim 7,
   wherein the first MISFET and the second MISFET are n-type transistors.

9. The method of manufacturing a semiconductor device according to claim 1,
   wherein the first MISFET is an n-type transistor, and
   wherein the second MISFET is a p-type transistor.

10. The method of manufacturing a semiconductor device according to claim 1,
    wherein in the step (e), an amount of nitrogen introduced to an interface between the semiconductor substrate and the first insulating film in the second region is smaller than an amount of nitrogen introduced to the interface between the semiconductor substrate and the second insulating film in the first region.

11. The method of manufacturing a semiconductor device according to claim 10,
    wherein in the step (e), the protective film acts as an anti-nitriding film.

12. The method of manufacturing a semiconductor device according to claim 1,
    wherein the semiconductor device further includes a third region where a third MISFET is formed,
    wherein an insulating layer is formed over the semiconductor substrate of the third region,
    wherein a first semiconductor layer is formed over the insulating layer,
    wherein the first insulating film formed in the step (a) is also formed over the first semiconductor layer of the third region,
    wherein the heat treatment in the step (e) is performed in a state where the first insulating film of the third region is covered with the protective film,
    wherein in the step (f), the protective film of the third region is also removed,
    wherein the method further includes the steps of:
    (i) after the step (f) and before the step (g), selectively removing the first insulating film of the third region so as to leave the second insulating film of the first region and the first insulating film of the second region; and
    (j) after the step (i), forming a fifth insulating film over the first semiconductor layer of the third region,
    wherein the first conductive film formed in the step (g) is also formed over the fifth insulating film of the third region, and wherein in the step (h), a third gate electrode is formed in the third region by patterning the first conductive film.

13. The method of manufacturing a semiconductor device according to claim 12,
wherein the fifth insulating film has a smaller thickness than the first insulating film.

14. The method of manufacturing a semiconductor device according to claim 13,
wherein the third MISFET is driven at a lower voltage than the first MISFET and the second MISFET.

* * * * *